(12) United States Patent
Kyozuka et al.

(10) Patent No.: US 8,941,230 B2
(45) Date of Patent: Jan. 27, 2015

(54) SEMICONDUCTOR PACKAGE AND MANUFACTURING METHOD

(71) Applicant: Shinko Electric Industries Co., Ltd., Nagano-ken (JP)

(72) Inventors: Masahiro Kyozuka, Nagano (JP); Akihiko Tateiwa, Nagano (JP); Yuji Kunimoto, Nagano (JP); Jun Furuichi, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 14/010,245

(22) Filed: Aug. 26, 2013

(65) Prior Publication Data

US 2014/0070396 A1   Mar. 13, 2014

(30) Foreign Application Priority Data

Sep. 12, 2012   (JP) ................. 2012-200488

(51) Int. Cl.
*H01L 23/12* (2006.01)
*H05K 3/46* (2006.01)
*H01L 25/11* (2006.01)
*H01L 25/10* (2006.01)
*H01L 23/10* (2006.01)
*H01L 23/00* (2006.01)

(52) U.S. Cl.
CPC ............... *H01L 24/46* (2013.01); *H01L 24/19* (2013.01); *H01L 2224/16225* (2013.01); *H01L 2224/48091* (2013.01); *H01L 2224/48227* (2013.01); *H01L 2224/73204* (2013.01); *H01L 2924/15311* (2013.01); *H01L 2224/73265* (2013.01)
USPC ...... 257/698; 257/668; 257/E23.14; 257/659; 257/E21.502; 257/774; 257/773; 257/784; 257/738; 257/737; 257/778; 257/E25.006; 257/E25.013; 257/E25.018; 257/E25.027; 257/E21.614; 257/E23.085; 257/706; 257/712; 257/713; 257/730; 257/731; 257/782; 257/758; 257/680; 361/763; 174/256

(58) Field of Classification Search
USPC ............ 257/698, 668, E23.14, 659, E21.502, 257/774, 773, 784, 738, 737, 778, 706, 712, 257/73, 730, 731, E25.006, 782, 786, 758, 257/680, E25.013, E25.018, E25.021, 257/E25.027, E21.64, E23.085; 361/763; 174/256
See application file for complete search history.

(56) References Cited

U.S. PATENT DOCUMENTS 7,656,015 B2   2/2010   Wong et al.
2009/0218118 A1*   9/2009   Tani .............................. 174/256

(Continued)

FOREIGN PATENT DOCUMENTS

JP   2008-300854 A   12/2008
JP   2011-119502 A   6/2011

*Primary Examiner* — Alexander Oscar Williams
(74) *Attorney, Agent, or Firm* — Wolf, Greenfield & Sacks, P.C.

(57) ABSTRACT

A metal plate covers an opening on the upper surface of a core substrate and exposes an outer edge of the upper surface of the core substrate. A conductive layer covers the lower surface of the core substrate. A semiconductor chip bonded to a first surface of the metal plate is exposed through the opening. A first insulating layer covers the upper and side surface of the metal plate and the outer edge of the upper surface of the core substrate. A second insulating layer fills the openings of the metal plate and the conductive layer and covers the outer edge of the lower surface of the core substrate, the conductive layer, and the semiconductor chip. The metal plate is thinner than the semiconductor chip. Total thickness of the conductive layer and the core substrate is equal to or larger than the thickness of the semiconductor chip.

5 Claims, 19 Drawing Sheets

(56) References Cited

U.S. PATENT DOCUMENTS

| | | | |
|---|---|---|---|
| 2012/0313226 A1* | 12/2012 | Koizumi et al. | 257/659 |
| 2014/0034373 A1* | 2/2014 | Yoshikawa et al. | 174/260 |
| 2014/0048906 A1* | 2/2014 | Shim et al. | 257/531 |
| 2014/0248742 A1* | 9/2014 | Gonzalez et al. | 438/107 |

* cited by examiner

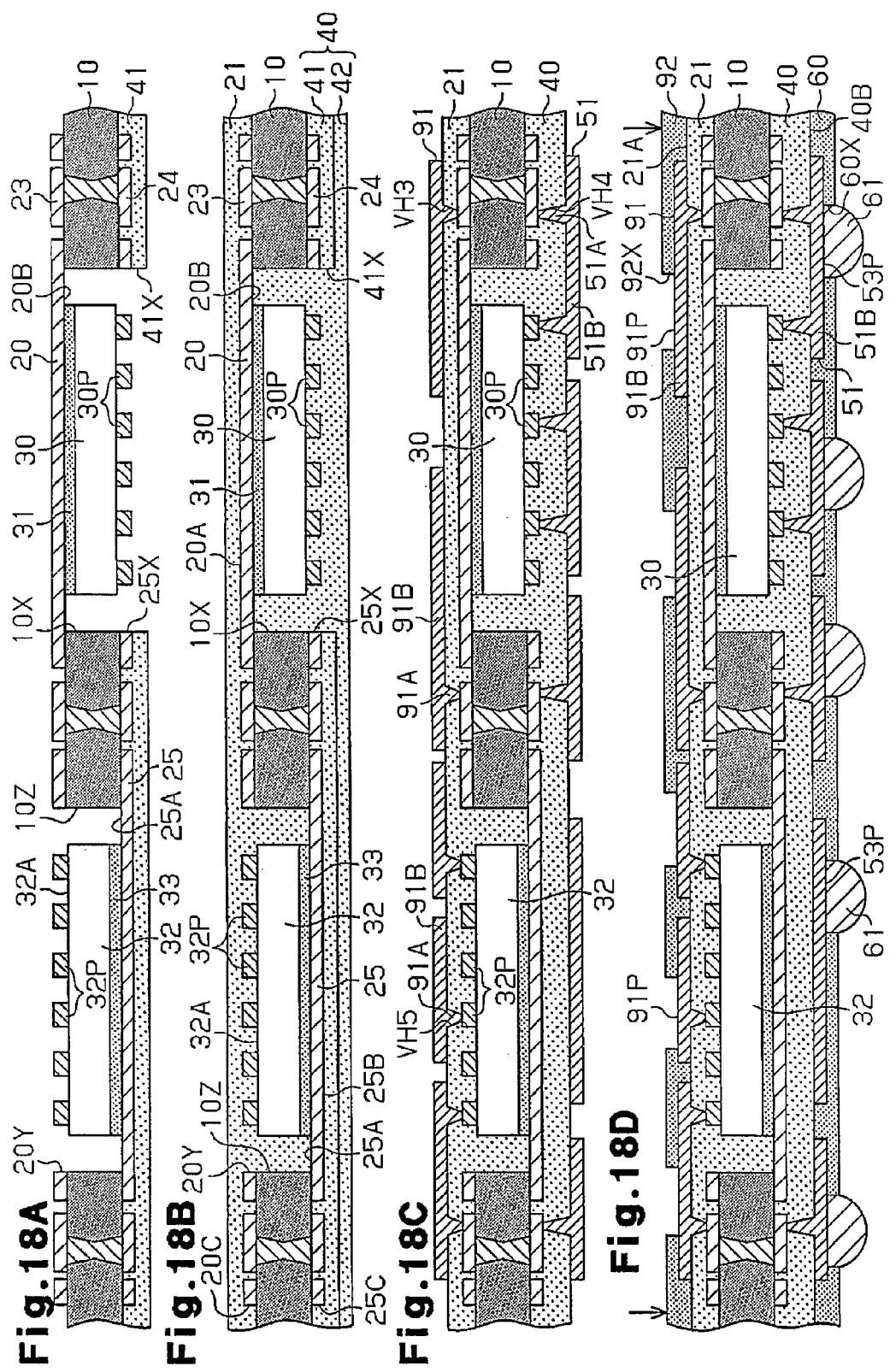

SEMICONDUCTOR PACKAGE AND MANUFACTURING METHOD

CROSS-REFERENCE TO RELATED APPLICATIONS

This application is based upon and claims the benefit of priority from prior Japanese Patent Application No. 2012-200488, filed on Sep. 12, 2012, the entire contents of which are incorporated herein by reference.

FIELD

This disclosure relates to a semiconductor package and a manufacturing method.

BACKGROUND

A semiconductor package having a semiconductor chip and a resin layer that covers the semiconductor chip has been known. For example, Japanese Laid-Open Patent Publication Nos. 2011-119502 and 2008-300854 describe a semiconductor package including an insulating layer that covers an active surface (circuit formation surface) and side surfaces of a semiconductor chip and a wiring structure that is stacked on the insulating layer and is electrically connected to the semiconductor chip.

A known method for such semiconductor packages is as follows. First, a support substrate is prepared. A semiconductor chip is mounted on the support substrate such that a surface of the semiconductor chip opposite to the active surface contacts the support substrate. An insulating layer is formed to seal the semiconductor chip. A wiring layer and an interlayer insulating layer are stacked on the insulating layer to form a wiring structure. Then, the support substrate is removed to complete the semiconductor package.

SUMMARY

According to the conventional method of manufacturing a semiconductor package, in the state where the semiconductor chip is fixed on the support substrate, and the insulating layer, the wiring layer, and the interlayer insulating layer are formed thereon, warp hardly occurs in the semiconductor package because of relatively high stiffness of the support substrate. However, the inventors found that when the support substrate is removed, a stress on the removed portion is released, possibly causing warp in the semiconductor package.

One aspect of the present disclosure is a semiconductor package including a core substrate made of a reinforcement-containing insulating resin, the core substrate including a first surface, a second surface opposite to the first surface, and a first opening penetrating the core substrate from the first surface to the second surface; a metal plate that covers an open end of the first opening on the first surface of the core substrate, the metal plate exposing an outer edge of the first surface of the core substrate and covering the first surface of the core substrate except for the outer edge; a conductive layer that covers the second surface of the core substrate and including an opening communicating with the first opening, the conductive layer exposing an outer edge of the second surface of the core substrate and covering the second surface of the core substrate except for the outer edge and the first opening; an electronic component bonded to a first surface of the metal plate exposed through the first opening; a first insulating layer that covers a second surface of the metal plate opposite to the first surface of the metal plate, a side surface of the metal plate, and the outer edge of the first surface of the core substrate; a second insulating layer that fills the first opening the second insulating layer covering the outer edge of the second surface of the core substrate, the conductive layer, and the electronic component; and a first wiring structure stacked on the second insulating layer, the first wiring structure including a first wiring layer electrically connected to the electronic component.

The metal plate is thinner than the electronic component, and a total thickness of the conductive layer and the core substrate is equal to or larger than a thickness of the electronic component.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 17A to 17D and FIGS. 18A to 18D are schematic sectional views illustrating a method of manufacturing the semiconductor package in accordance with the third embodiment;

DETAILED DESCRIPTION OF EMBODIMENTS

Each embodiment will be described below with reference to appended figures. In the appended figures, a characteristic portion may be enlarged to clarify the characteristic, and each constituent is not drawn to scale. In sectional views, hatching of some members is omitted to clarify a sectional structure of each member.

Figure 1:
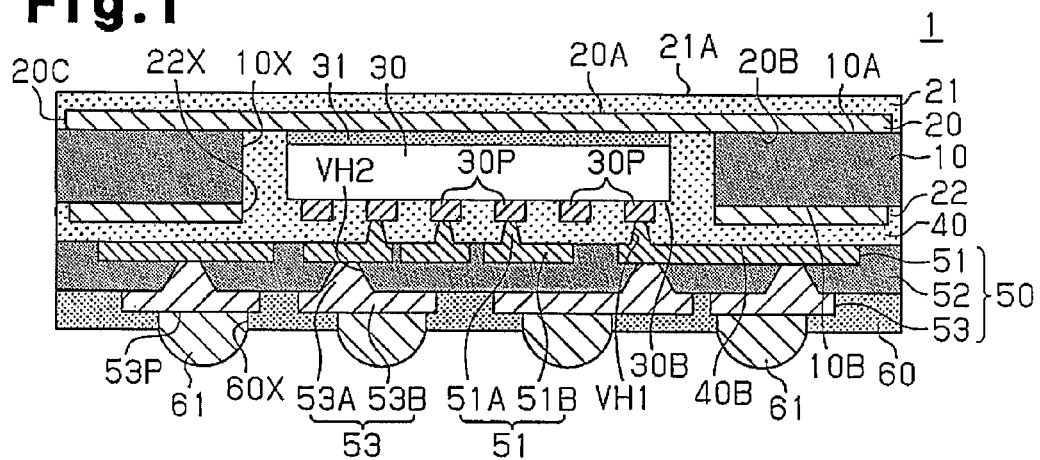
FIG. 1 is a schematic sectional view illustrating a semiconductor package in accordance with the first embodiment.

The first embodiment will be described below with reference to FIG. 1 to FIG. 6. FIG. 1 is a sectional view taken along a line A-A in FIG. 2. As illustrated in FIG. 1, a semiconductor package 1 has a core substrate 10, a metal plate 20, an insulating layer 21, a conductive layer 22, a semiconductor chip 30, an insulating layer 40, a wiring structure 50, and a solder resist layer 60.

The core substrate 10 is provided in the middle of the semiconductor package 1 in the thickness direction. The core substrate 10 is, for example, a substantially rectangular flat plate in a plan view. A reinforcement-containing insulating resin obtained by impregnating woven fabric or nonwoven fabric of glass, aramid, or LCP (Liquid Crystal Polymer) fibers with an epoxy or polyimide thermosetting resin may be used as a material for the core substrate 10. The core substrate 10 is a substrate having a higher mechanical strength (stiffness or hardness) than the insulating layers 21, 40 and the like. The material for the core substrate 10 is preferably an insulating resin adjusted such that a thermal expansion coefficient of the core substrate 10 is closer to a thermal expansion coefficient of the semiconductor chip 30 than thermal expansion coefficients of the insulating layers 21 and 40. For example, the material for the core substrate 10 is preferably an insulating resin adjusted such that the thermal expansion coefficient of the core substrate 10 is lower than the thermal expansion coefficients of the insulating layers 21 and 40. For example, the thermal expansion coefficient of the core substrate 10 is set to, for example, about 18 to 30 ppm/° C. In the illustrated example, a thickness of the core substrate 10 is, for example, the substantially same as that of a built-in (embedded) semiconductor chip 30. For example, a thickness of the core substrate 10 can be set to about 50 to 200 μm. The dimension of the core substrate 10 can be set to about 8 mm×8 mm to 17 mm×17 mm in a plan view. The insulating layer 21 is an example of a first insulating layer. The insulating layer 40 is an example of a second insulating layer.

The core substrate 10 has an opening 10X at a required position (for example, one position). The opening 10X penetrates the core substrate 10 between a first surface (upper surface in FIG. 1) 10A and a second surface (lower surface in FIG. 1) 10B.

Figure 2:
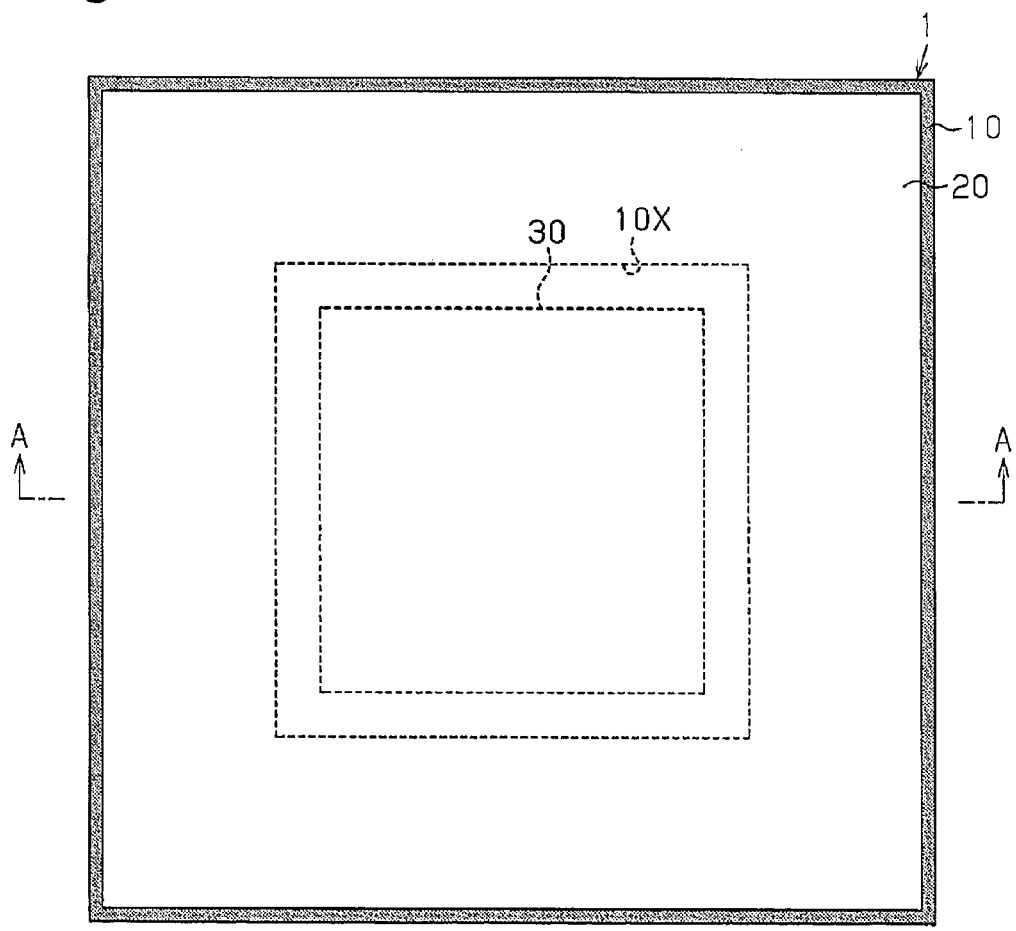
FIG. 2 is a schematic plan view illustrating the semiconductor package in FIG. 1 when viewed from above, omitting a member (insulating layer) of the semiconductor package.

As illustrated in FIG. 2, the opening 10X is formed at the center of the core substrate 10 in a plan view, for example, so as to overlap the semiconductor chip 30 in a plan view. Like the semiconductor chip 30, the opening 10X has a rectangular shape in the plan view. The opening 10X is larger than the semiconductor chip 30 in the plan view. Accordingly, the semiconductor chip 30 is provided inner than an outer edge of the opening 10X (refer to a frame represented by an outer broken line), that is, accommodated in the opening 10X. The dimension of the opening 10X may be set to about 5 mm×5 mm to 15 mm×15 mm in the plan view.

As illustrated in FIG. 1, the upper surface 10A of the core substrate 10 has a metal plate 20. The metal plate 20 has a first surface (lower surface in FIG. 1) 20B, a second surface (upper surface in FIG. 1) 20A, and side surfaces 20C. The metal plate 20 is thinner than the semiconductor chip 30. For example, to reduce warp of the semiconductor package 1, the thickness of the metal plate 20 is preferably about 50 to 95% of that of the semiconductor chip 30. The thickness of the metal plate 20 may be about 15 to 100 μm. Examples of a material for the metal plate 20 include copper (Cu), aluminum (Al), iron (Fe), nickel (Ni), and an alloy containing at least one of these metals.

As illustrated in FIG. 2, the metal plate 20 exposes the outer edge of the upper surface 10A of the core substrate 10 but covers the upper surface 10A except for the outer edge. The metal plate 20 covers or closes one open end of the opening 10X (for example, the open end on the side of the upper surface 10A of the core substrate 10). The outer dimension of the metal plate 20 (planar shape) is set to be smaller than the outer dimension of the semiconductor package 1 (planar shape) and to be larger than the outer dimension of the semiconductor chip 30. For example, the planar shape of the metal plate 20 is set such that the ratio of the area of the metal plate 20 to the area of the insulating layer 21 in FIG. 1 is about 50 to 95%. For the metal plate 20 made of copper, the planar shape of the metal plate 20 is set such that the ratio of remaining copper in the metal plate 20 is in the range of about 50 to 95%.

The insulating layer 21 covers the upper surface 20A and the side surfaces 20C of the metal plate 20 and the outer edge of the upper surface 10A of the core substrate 10 which is exposed from the metal plate 20. The insulating layer 21 is the outermost insulating layer in the semiconductor package 1. That is, a first surface (upper surface in FIG. 1) 21A of the insulating layer 21 is exposed from the semiconductor package 1. A thickness from the upper surface 20A of the metal plate 20 to the upper surface 21A of the insulating layer 21 may be set to about 20 to 40 μm. Thermosetting epoxy or acryl insulating resins can be adopted as the material for the insulating layer 21. The thermal expansion coefficient of the epoxy resin is about 46 ppm/° C. in the range lower than the glass transition temperature Tg (for example, 150° C.), and about 120 ppm/° C. in the range of the glass transition temperature Tg or higher. The insulating resins are not limited to thermosetting resins, and may be photosensitive insulating resins. To reduce warp of the semiconductor package 1, the material for the insulating layer 21 is preferably the same as that for the insulating layer 40 formed on the lower surface 20B of the metal plate 20.

The lower surface 10B of the core substrate 10 has the conductive layer 22. The conductive layer 22 is thinner than the semiconductor chip 30. The thickness of the conductive layer 22 may be set to about 10 to 30 μm. Examples of the material for the conductive layer 22 include copper, aluminum, iron, nickel and an alloy containing at least one of these metals.

The conductive layer 22 exposes the outer edge of the lower surface 10B of the core substrate 10 but covers the lower surface 10B except for the outer edge and the opening 10X. The conductive layer 22 has an opening 22X having the substantially same dimension as the opening 10X, which is substantially rectangular in a plan view, at a position facing the opening 10X of the core substrate 10 (at a position where the opening 22X and the opening 10X overlap with each other in the plan view). Accordingly, the opening 10X and the opening 22X communicate with each other, and the lower surface 20B of the metal plate 20 is exposed from the openings 10X, 22X. The conductive layer 22 may have a recognition mark such as an alignment mark used when the semiconductor chip is installed.

Examples of the semiconductor chip 30 include logic chips such as a CPU (Central Processing Unit) chip and a GPU (Graphics Processing Unit) chip. Other examples of the semiconductor chip 30 include memory chips such as a DRAM (Dynamic Random Access Memory) chip, an SRAM (Static Random Access Memory) chip, and a flash memory chip.

The semiconductor chip 30 is formed of, for example, a semiconductor substrate. Silicon (Si) may be adopted as the material for the semiconductor substrate. The semiconductor chip 30 has a semiconductor integrated circuit (not illustrated) on a circuit formation surface (lower surface in FIG. 1) 30B. Though not illustrated, the semiconductor integrated circuit has a diffusion layer formed on the semiconductor substrate, an insulating layer stacked on the semiconductor substrate, and a via and a wiring on the stacked insulating layer. The semiconductor integrated circuit also has an electrode pad (not illustrated) electrically connected to the semiconductor integrated circuit, and an electrode terminal 30P is provided on the electrode pad. The electrode terminal 30P is a columnar conductive post extending downward from the circuit formation surface 30B of the semiconductor chip 30. The height of the electrode terminal 302 may be set to about 10 to 30 µm. For the columnar electrode terminal 30P, the diameter of the electrode terminal 302 may be set to about 30 to 50 µm. Examples of the material for the electrode terminal 302 include copper and copper alloy.

The semiconductor chip 30 may have a dimension of 5 mm×5 mm to 11 mm×11 mm in a plan view. The semiconductor chip 30 may have a thickness of about 50 to 200 µm. A total thickness of the conductive layer 22 and the core substrate 10 is equal to or larger than the thickness of the semiconductor chip 30 (including the circuit formation surface 30B or the electrode terminal 30P). In the first embodiment, the semiconductor chip 30 is made of silicon, and the thermal expansion coefficient of the semiconductor chip 30 is about 3.4 ppm/° C.

The semiconductor chip 30 is bonded to the lower surface 20B of the metal plate 20 via a bonding member 31. For example, the semiconductor chip 30 is bonded to the lower surface 20B of the metal plate 20 which is exposed from the opening 10X of the core substrate 10, via the bonding member 31. For example, the semiconductor chip 30 is bonded to the lower surface 20B of the metal plate 20 via the bonding member 31, with a surface opposite to the circuit formation surface 30B (for example, upper surface) facing the lower surface 20B of the metal plate 20, that is, in a face-up state. For example, the semiconductor chip 30 is housed in a housing portion defined by the metal plate 20 and the opening 10X of the core substrate 10, with the electrode terminal 302 facing downward. The semiconductor chip 30 bonded to the metal plate 20 is also thermally connected to the metal plate 20 via the bonding member 31.

Examples of the material for the bonding member 31 include silicon polymer and epoxy resin. The bonding member 31 may have a thickness of about 5 to 20 µm.

The insulating layer 40 covers the outer edge of the lower surface 10B of the core substrate 10 which is exposed from the conductive layer 22, an inner side surface of the opening 10X, the lower surface 20B of the metal plate 20, the lower surface 30B and side surfaces of the semiconductor chip 30, the entire electrode terminal 30P, and the entire conductive layer 22. The insulating layer 40 fills the opening 10X of the core substrate 10 and the opening 22X of the conductive layer 22. The insulating layer 40 has a flat first surface (lower surface in FIG. 1) 40B on the side of the wiring structure 50. A thermosetting epoxy insulating resin can be adopted as the material for the insulating layer 40. The insulating resins are not limited to thermosetting resins, and may be photosensitive insulating resins. The thickness from the lower surface 20B of the metal plate 20 to the lower surface 40B of the insulating layer 40 may be set to about 80 to 160 µm.

The insulating layer 40 has a via hole VH1 that penetrates the insulating layer 40 and exposes a lower surface of the electrode terminal 30P of the semiconductor chip 30.

The wiring structure 50 is stacked on the lower surface of the insulating layer 40. The wiring structure 50 is formed by alternately stacking the wiring layer and the interlayer insulating layer. The number of stacked wiring layers may be any value, and the interlayer insulating layer may have a thickness that causes the wiring layers to be isolated from each other. The wiring structure 50 in the first embodiment has a first wiring layer 51, an interlayer insulating layer 52, and a second wiring layer 53. The wiring structure 50 is an example of the first wiring structure.

The first wiring layer 51 is stacked on the insulating layer 40. The first wiring layer 51 has a via wire 51A filled in the via hole VH1 and a wiring pattern 51B formed on the lower surface 40B of the insulating layer 40. The via wire 51A is electrically connected to the electrode terminal 30P exposed from the bottom of the via hole VH1, and is also electrically connected to the wiring pattern 51B. In the illustrated example, the via hole VH1 and the via wire 51A expand in diameter from the upper side (the side of the semiconductor chip 30) toward the lower side (wiring pattern 51B) in FIG. 1, that is, are formed in a tapered shape. The via hole VH1 and the via wire 51A are circular in a plan view. The diameter of each of the via hole VH1 and the via wire 51A may be set to about 20 to 40 µm. The wiring pattern 51B may have a thickness of about 8 to 35 µm. Examples of the material for the first wiring layer 51 (the via wire 51A and the wiring pattern 51B) include copper and copper alloy.

The interlayer insulating layer 52 is the bottommost (outermost) interlayer insulating layer formed on the insulating layer 40 so as to cover the first wiring layer 51 (for example, the outermost interlayer insulating layer located opposite to the insulating layer 21). To increase the stiffness of the entire semiconductor package 1, the interlayer insulating layer 52 may be a reinforcement-containing insulating layer having a higher mechanical strength (stiffness or hardness) than the insulating layers 21 and 40. An insulating resin obtained by adding a reinforcement to a thermosetting resin may be adopted as the material for the interlayer insulating layer 52. For example, a reinforcement-containing insulating resin obtained by impregnating woven or nonwoven fabric of glass, aramid, LCP (Liquid Crystal Polymer) fibers with epoxy or polyimide thermosetting resin may be adopted as the material for the interlayer insulating layer 52. The material for the interlayer insulating layer 52 is preferably an insulating resin adjusted such that the thermal expansion coefficient of the interlayer insulating layer 52 is closer to the thermal expansion coefficient of the semiconductor chip 30 than the thermal expansion coefficients of the insulating layers 21 and 40. For example, the material for the interlayer insulating layer 52 is preferably an insulating resin adjusted such that the thermal expansion coefficient of the interlayer insulating layer 52 is lower than the thermal expansion coefficients of the insulating layers 21 and 40. The thermal expansion coefficient of the interlayer insulating layer 52 is set to, for example, about 18 to 30 ppm/° C. The thickness from the lower surface 40B of the insulating layer 40 to the lower surface of the interlayer insulating layer 52 may be set to about 35 to 70 µm. The thickness from the lower surface of the wiring pattern 51B to the lower surface of the interlayer insulating layer 52 may be set to about 20 to 30 μm.

The interlayer insulating layer 52 has a via hole VH2 that penetrates the interlayer insulating layer 52 and exposes the lower surface of the wiring pattern 51B.

The second wiring layer 53 is the bottommost (outermost) wiring layer stacked on the interlayer insulating layer 52. The second wiring layer 53 has a via wire 53A filled in the via hole VH2 and a wiring pattern 53B formed on the lower surface of the interlayer insulating layer 52. The via wire 53A is electrically connected to the first wiring layer 51 exposed from the bottom of the via hole VH2 and is also electrically connected to the wiring pattern 533. The via hole VH2 and the via wire 53A expand in diameter from the lower side toward the upper side in FIG. 1, that is, are formed in a tapered shape. The via hole VH2 and the via wire 53A may be circular in a plan view, and have a thickness of about 50 to 75 μm. The thickness of the wiring pattern 53B may be set to about 15 to 35 μm. Examples of the material for the second wiring layer 53 (the via wire 53A and the wiring pattern 53B) include copper and copper alloy.

The solder resist layer 60 is formed on the interlayer insulating layer 52 so as to partially cover the second wiring layer 53. The solder resist layer 60 has an opening 60X for exposing a part of the wiring pattern 53B as an external connection pad 53P. An external connection terminal 61 such as a solder ball, a lead pin, or the like, which is used to install the semiconductor package 1 on a mother board or the like, is connected to the external connection pad 53P. The wiring pattern 53B exposed from the opening 60X may be subjected to an OSP (Organic Solderbility Preservative) treatment as needed to form an OSP film, and the external connection terminal 61 may be connected to the OSP film. A metal layer may be formed on the wiring pattern 53B exposed from the opening 60X, and the external connection terminal 61 may be connected to the metal layer. Examples of the metal layer include a gold (Au) layer, a Ni/Au layer (a metal layer in which a Ni layer and an Au layer are stacked in this order), and a Ni/palladium (Pd)/Au layer (a metal layer in which a Ni layer, a Pd layer, and an Au layer are stacked in this order). The wiring pattern 53B exposed from the opening 60X (or, when the OSP film or the metal layer is formed on the wiring pattern 53B, the OSP film or the metal layer) itself may be the external connection terminal.

In the illustrated example, the opening 60X and the external connection pad 53P are arranged in a matrix or peripheral manner in a plan view. The opening 60X and the external connection pad 53P are, for example, circular in a plan view, and their diameters may be set to about 200 to 300 μm. The thickness from the lower surface of the interlayer insulating layer 52 to the lower surface of the solder resist layer 60 may be set to about 20 to 40 μm. Examples of the material for the solder resist layer 60 include epoxy or acryl insulating resin.

The thickness of the semiconductor package 1 having such configuration may be set to about 200 to 600 μm.

Figure 23:
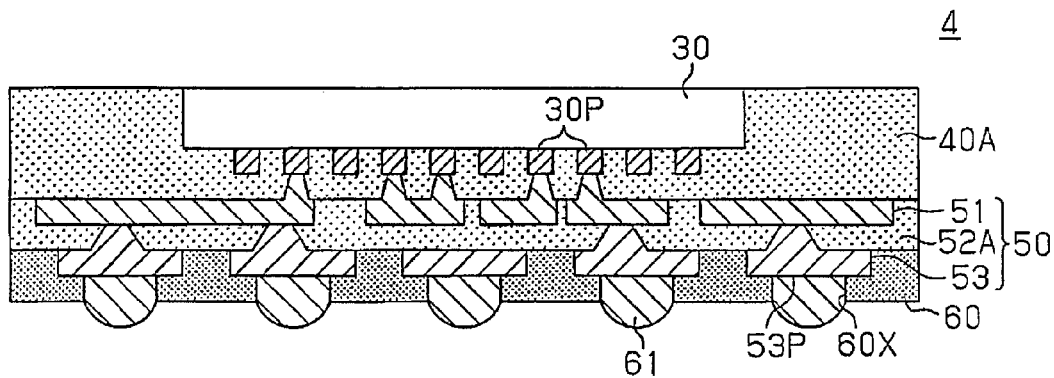
FIG. 23 is a schematic sectional view illustrating a semiconductor package in the first reference example.

Warp of a semiconductor package 4 in the first reference example will be described below with reference to FIG. 23. In the semiconductor package 4 in the first reference example, the metal plate 20 and the insulating layer 21 are not formed, an insulating layer 40A made of an insulating resin of the same composition as that of the insulating layer 40 is formed in place of the core substrate 10 and the insulating layer 40, and an interlayer insulating layer 52A made of an insulating resin of the same composition as that of the insulating layer 40 is formed in place of the interlayer insulating layer 52. In the semiconductor package 4, on the side of the semiconductor chip 30, the contraction amount occurred at cooling after thermal treatment depends on physical values (thermal expansion coefficient, elastic modulus and the like) of the semiconductor chip 30, that is, physical values of silicon. On the side of the wiring structure 50, the contraction amount occurred at cooling after thermal treatment depends on physical values of the wiring structure 50, that is, physical values of the interlayer insulating layer 52A. As described above, the thermal expansion coefficient of silicon is 3.4 ppm/° C., while the thermal expansion coefficient of the epoxy resin as the interlayer insulating layer 52A is 46 ppm/° C. in the temperature range lower than the glass transition temperature Tg (150° C.), and 120 ppm/° C. in the temperature range of the glass transition temperature Tg or higher. In the semiconductor package 4 in the first reference example, when the semiconductor package 4 is viewed in the vertical direction (thickness direction), distribution of the physical values (thermal expansion coefficient, elastic modulus and the like) is vertically asymmetrical. For this reason, disadvantageously, the semiconductor package 4 is easy to have warp.

Figure 24:
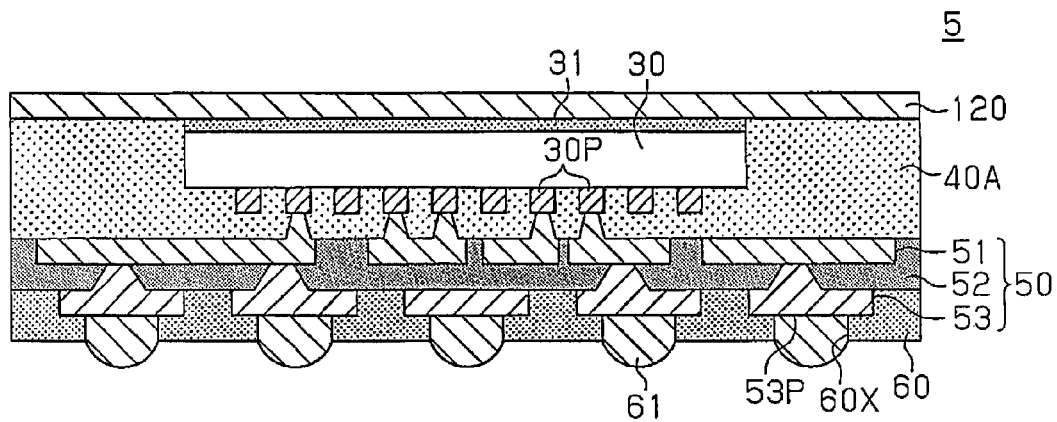
FIG. 24 is a schematic sectional view illustrating a semiconductor package in the second reference example.

A semiconductor package 5 in the second reference example in FIG. 24 includes a metal plate 120 that covers the entire upper surface of the insulating layer 40A. The semiconductor package 5 can prevent the occurrence of warp better than the semiconductor package 4. However, since distribution of the physical values is vertically asymmetrical when the semiconductor package 5 is vertically viewed, warp easily occurs.

On the contrary, in the semiconductor package 1 in the first embodiment, as illustrated in FIG. 1, the metal plate 20 and the insulating layer 21 are formed on the opposite side to the wiring structure 50 with respect to the semiconductor chip 30. As a result, the wiring structure 50 in which the first and second wiring layers 51 and 53 and the interlayer insulating layer 52 are stacked is formed on the side of the lower surface 30B of the semiconductor chip 30, and the metal plate 20 and the insulating layer 21 are formed on the opposite side to the lower surface 30B. Accordingly, distribution of the physical values (thermal expansion coefficient, elastic modulus and the like) becomes vertically symmetrical with respect to the semiconductor chip 30. That is, the semiconductor package 1 is superior to the semiconductor packages 4, 5 in vertical balance of the physical values with respect to the semiconductor chip 30, preventing warp and deformation of the semiconductor package 1 due to thermal contraction and the like.

The mechanical strength of the entire semiconductor package 1 can be increased by providing the core substrate 10 made of the reinforcement-containing insulating resin, that is, the core substrate 10 having a high mechanical strength. This can reduce warp in the semiconductor package 1.

Since the entire surface of the metal plate 20 including the side surfaces 20C is covered by the core substrate 10, the insulating layer 21, and the insulating layer 40, oxidation of the metal plate 20 is suppressed.

Next, a method of manufacturing the semiconductor package 1 will be described. Although one enlarged semiconductor package will be described below, in fact, a member that will become a plurality of semiconductor packages 1 is manufactured on one substrate and then, the member is separated into individual semiconductor packages 1.

Figure 3A:
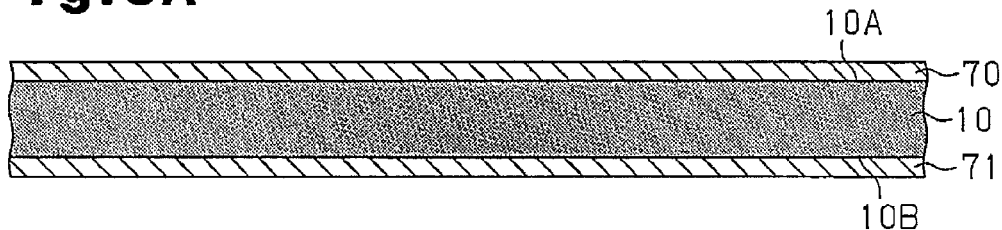
FIGS. 3A to 3D, FIGS. 4A to 4D, FIGS. 5A to 5C, and FIGS. 6A to 6D are schematic sectional views illustrating a method of manufacturing the semiconductor package in accordance with the first embodiment.

As illustrated in FIG. 3A, first, a metal layer 70 that is a base material for the metal plate 20 is adhered to the upper surface 10A of the core substrate 10, and a metal layer 71 that is a base material for the conductive layer 22 is adhered to the lower surface 10B to prepare a Copper Clad Laminated (CCL). A large substrate for a number of semiconductor packages 1 is used as the core substrate 10. The metal layer 70 is an example of a first metal layer. The metal layer 71 is an example of a second metal layer.

Figure 3B:
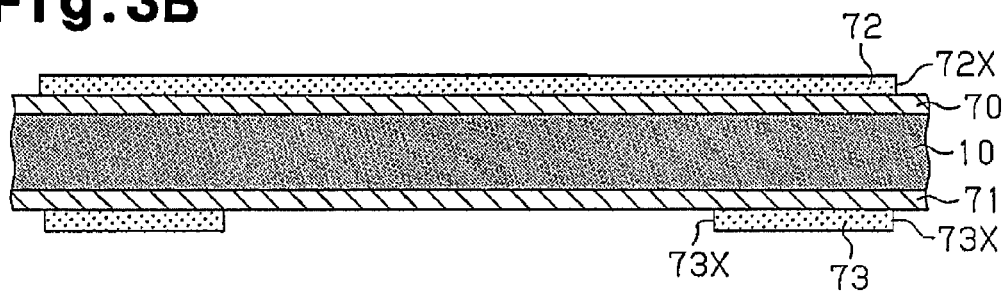

Next, in a step illustrated in FIG. 3B, a resist layer 72 having an opening 72X at a predetermined position is formed on an upper surface of the metal layer 70, and a resist layer 73 having an opening 73X at a predetermined position is formed on a lower surface of the metal layer 71. The resist layer 72 covers a portion of the metal layer 70, which corresponds to the metal plate 20 in FIG. 1. The resist layer 73 covers a portion of the metal layer 71, which corresponds to the conductive layer 22 in FIG. 1. Materials resistant to etching in a next step may be used as materials for the resist layers 72 and 73. Examples of the materials for the resist layers 72 and 73 include photosensitive dry film resist and liquid photoresist (for example, dry film resist or liquid resist such as novolac resin and acrylic resin). For the photosensitive dry film resist, a dry film is laminated on each of the upper surface of the metal layer 70 and the lower surface of the metal layer 71 by thermocompression bonding, and the laminated dry films are patterned by exposure and development, forming the openings 72X and 73X. As a result, the resist layer 72 having the opening 72X is formed on the upper surface of the metal layer 70, and the resist layer 73 having the opening 73X is formed on the lower surface of the metal layer 71. For the liquid photoresist, the resist layers 72 and 73 can be formed through the same steps.

Figure 3C:
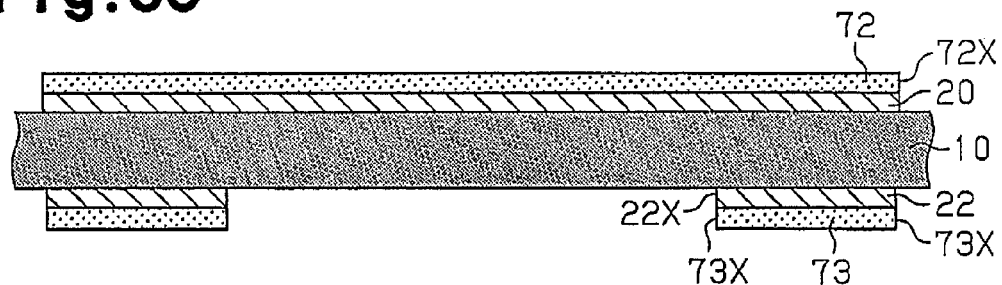

Subsequently, using the resist layers 72 and 73 as etching masks, the metal layers 70 and 71 are etched. For example, the metal layers 70 and 71 exposed from the openings 72X and 73X of the resist layers 72 and 73 are etched respectively, to be patterned in a predetermined shape. Thereby, as illustrated in FIG. 3C, the metal plate 20 of substantially rectangular in a plan view is formed on the upper surface 10A of the core substrate 10. The conductive layer 22 having the opening 22X of the same planar shape as the opening 10X in FIG. 1 is formed on the lower surface 10B of the core substrate 10. According to such patterning, the outer dimension of the metal plate 20 becomes smaller than that of the core substrate 10.

For example, when the metal layers 70 and 71 are patterned by wet etching (isotropic etching), an etchant used in wet etching can be appropriately selected according to the materials for the metal layers 70 and 71. When copper is used as the material for the metal layers 70 and 71, aqueous ferric chloride or aqueous cupric chloride may be used as the etchant, and the metal layers 70 and 71 may be patterned by spray etching from the upper surface of the metal layer 70 and the lower surface of the metal layer 71.

Figure 3D:
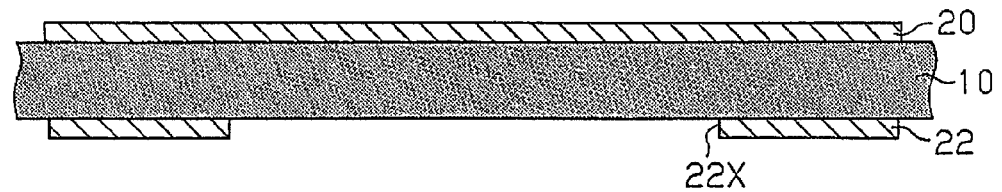

Next, in a step illustrated in FIG. 3D, the resist layers 72 and 73 illustrated in FIG. 3C are removed by using, for example, an alkaline stripping agent.

Figure 4A:
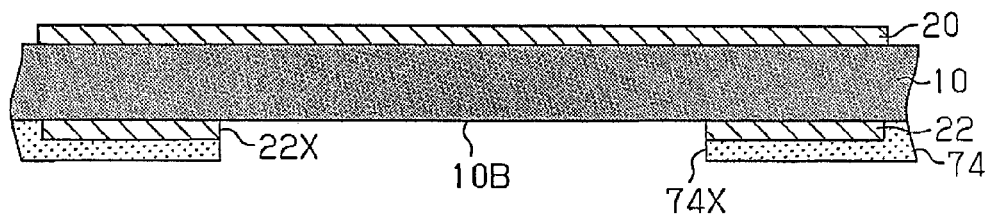

Next, in a step illustrated in FIG. 4A, a sandblast-protecting mask 74 having an opening 74X of a predetermined pattern is formed on the lower surface 10B of the core substrate 10. For example, the mask 74 having the opening 74X of the same planar shape as the opening 22X at a required position of the core substrate 10 (a position where the opening 74X and the opening 22X of the conductive layer 22 overlap with each other in a plan view, that is, where the opening 10X is to be formed) is formed. For example, the mask 74 is formed such that the lower surface 10B of the core substrate 10 exposed from the opening 22X is exposed. For example, a dry film resist is laminated on the lower surface 10B of the core substrate 10 by thermocompression bonding so as to cover the entire lower surface 10B, and the dry film resist is patterned by exposure and development to form the mask 74 having the opening 74X.

Subsequently, in a step illustrated in FIG. 4B, the opening 10X is formed at a required position of the core substrate 10. For example, the opening 10X can be formed by sandblasting the core substrate 10 through the opening 74X of the mask 74. Adhesive grains are blown to the lower surface 10B of the core substrate 10 which is exposed from the opening 74X of the mask 74 to sandblast the core substrate 10 until the core substrate 10 is removed. Thereby, the opening 10X of the core substrate 10 is formed, and the openings 10X and 22X are communicated. Then, a portion of the lower surface 20B of the metal plate 20 is exposed from the openings 10X and 22X. The opening 10X can be formed according to blasting such as sandblasting, but can be also formed according to laser processing using a $CO_2$ laser, a UV-YAG laser and the like, router processing, and dry etching using plasma. When the opening 10X is formed according to the laser processing, remaining resin (resin smears) in the opening 10X is removed by desmear. The desmear can be performed with, for example, permanganate.

Figure 4B:
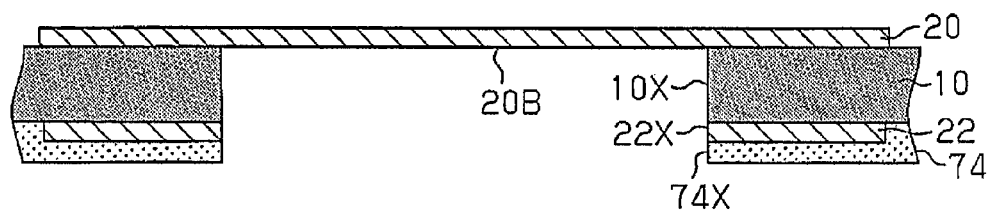
Figure 4C:
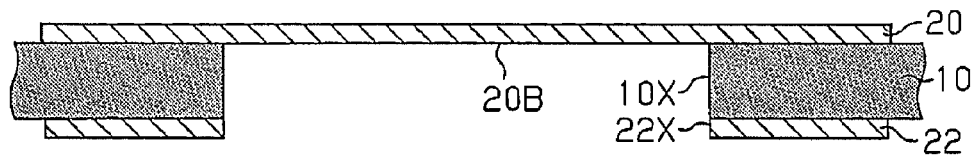

After that, in a step illustrated in FIG. 4C, the mask 74 illustrated in FIG. 4B is removed by using, for example, an alkaline stripping agent.

Figure 4D:
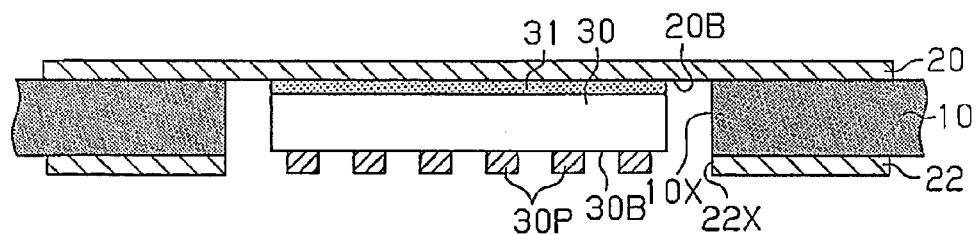

Next, in a step illustrated in FIG. 4D, the semiconductor chip 30 is mounted on the lower surface 20B of the metal plate 20 which is exposed from the opening 10X. For example, the semiconductor chip 30 is bonded to the lower surface 20B via the bonding member 31 such that a surface of the semiconductor chip 30 opposite to the circuit formation surface 30B faces the lower surface 20B of the metal plate 20, that is, in a face-up state. For example, the semiconductor chip 30 is bonded to the lower surface 20B via the bonding member 31 by previously applying the bonding member 31 to the lower surface 20B of the metal plate 20, and heating and pressing the semiconductor chip 30 placed on the lower surface 20B in the face-up state. In an example, the lower surface 10B of the core substrate 10 is located at the same level as the circuit formation surface 30B of the semiconductor chip 30 or at a higher level than the circuit formation surface 30B by about 10 to 30 μm. Further, the lower surface of the conductive layer 22 is located at the same level as the lower surface of the electrode terminal 30P of the semiconductor chip 30, or at a higher level than the lower surface of the electrode terminal 30P by about 10 to 30 μm. That is, the total thickness of the conductive layer 22 and the core substrate 10 is equal to or larger than the total thickness of the bonding member 31, the semiconductor chip 30, and the electrode terminal 30P. The opening 10X of the core substrate 10 and the opening 22X of the conductive layer 22 each have a depth that is equal to or larger than the total thickness of the bonding member 31, the semiconductor chip 30, and the electrode terminal 30P. The semiconductor chip 30 is housed in a housing part defined by the openings 10X and 22X and the metal plate 20, and is mounted on the metal plate 20.

Subsequently, in a step illustrated in FIG. 5A, a structure 77 formed by adhering a sheet-like insulating layer 76 that becomes the insulating layer 21 to a carrier 75, and a structure 80 formed by adhering a sheet-like insulating layer 79 that becomes the insulating layer 40 to a carrier 78 are prepared. The insulating layers 76 and 79 in a semi-hardened state (so-called B-stage state) are used. The insulating layer 76 may have a thickness of about 20 to 70 μm, and the insulating layer 79 may have a thickness of about 40 to 70 μm. A copper foil may be used as the carriers 75 and 78 for carrying the insulating layers 76 and 79, respectively. The carriers 75 and 78 each may have a thickness of about 50 to 70 μm. The carriers 75 and 78 may be omitted.

Figure 5A:
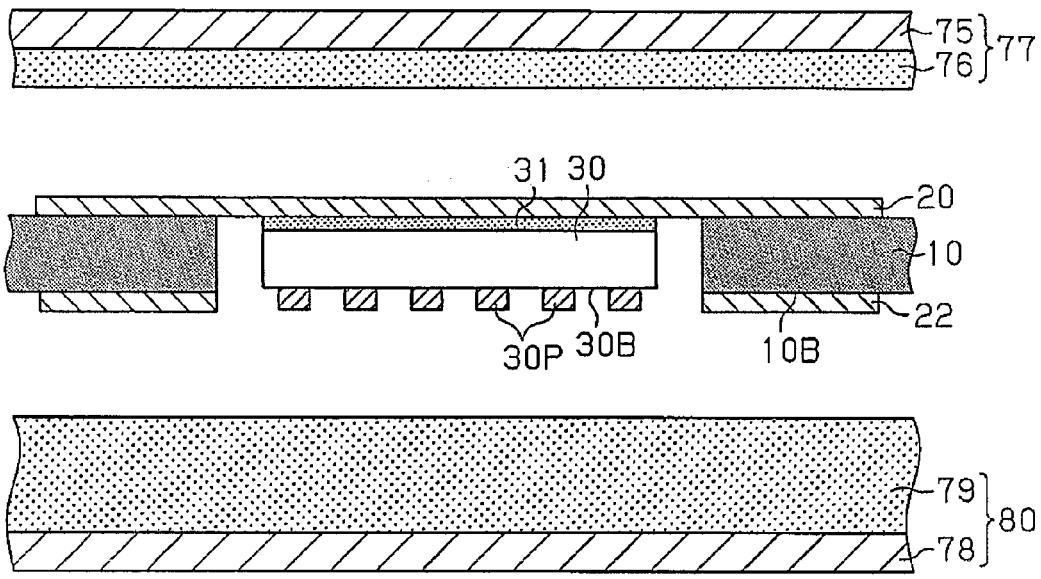
Figure 5B:
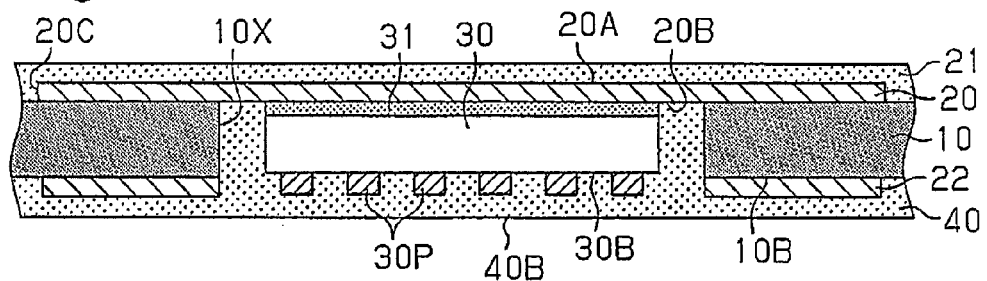

In a step illustrated in FIG. 5A, the structure 77 is arranged on the side of the upper surface 10A of the core substrate 10, and the structure 80 is arranged on the side of the lower surface 10B of the core substrate 10. In the structure 77, the insulating layer 76 faces downward so as to face the metal plate 20. In the structure 80, the insulating layer 79 faces upward so as to face the electrode terminal 30P of the semiconductor chip 30. Then, the insulating layers 76 and 79 are heated and pressed from both sides in a vacuum atmosphere in the range of 110 to 130° C. After that, the insulating layers 76 and 79 are hardened by curing (thermosetting treatment) in the range of 170 to 190° C. Thereby, the insulating layer 79 is filled in the opening 10X, the semiconductor chip 30 and the conductive layer 22 are press-fitted into the insulating layer 79, and the metal plate 20 is press-fitted into the insulating layer 76. The insulating layer 76 is hardened through the thermosetting treatment, forming the insulating layer 21 that covers the upper surface 20A and the side surfaces 20C of the metal plate 20 as illustrated in FIG. 5B. Further, the insulating layer 79 is hardened through the thermosetting treatment, forming the insulating layer 40 that covers the lower surface 10B of the core substrate 10, the inner side surface of the opening 10X, the lower surface 20B of the metal plate 20, the circuit formation surface 30B and side surfaces of the semiconductor chip 30, the electrode terminal 30P, and the lower surface and the side surfaces of the conductive layer 22. When the insulating layer 79 is laminated by thermocompression bonding, as described above, the lower surface 10B of the core substrate 10 is located at the same level as the circuit formation surface 30B of the semiconductor chip 30, or at a higher level than the circuit formation surface 30B by about 10 to 30 μm. Therefore, the lower surface 40B of the insulating layer 40 can be made flat.

After formation of the insulating layers 21 and 40, the carriers 75 and 78 illustrated in FIG. 5A are removed from the insulating layers 21 and 40. When the carriers 75 and 78 are copper foils, the carriers 75 and 78 can be selectively removed from the insulating layers 21 and 40 by wet etching using aqueous ferric chloride, aqueous cupric chloride, or aqueous ammonium persulfate. In the steps illustrated in FIG. 5A and FIG. 5B, in the case where the carriers 75 and 78 are omitted, as a matter of course, the step of removing the carriers 75 and 78 can be omitted.

Figure 5C:
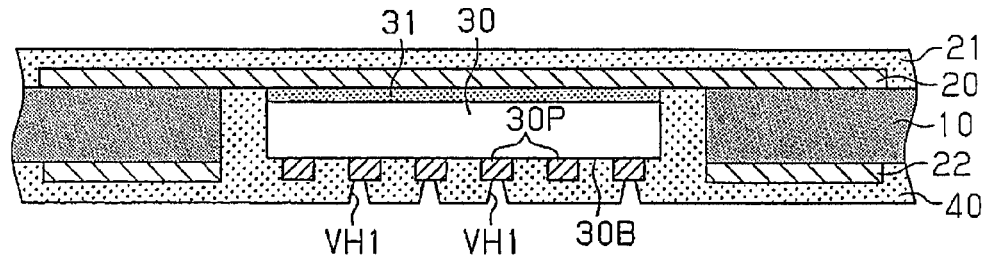

Next, in a step illustrated in FIG. 5C, the via hole VH1 is formed at a predetermined position of the insulating layer 40 so as to expose a portion of the lower surface of the electrode terminal 30P. The via hole VH1 can be formed by the laser processing using, for example, $CO_2$ laser, UV-YAG laser or the like. When the insulating layer 40 is made of photosensitive resin, the via hole VH1 may be formed by photolithography.

Subsequently, when the via hole VH1 is formed by laser processing, desmear is performed to remove resin smears in the via hole VH1. Such desmear can be achieved by using permanganate, for example.

Figure 6A:
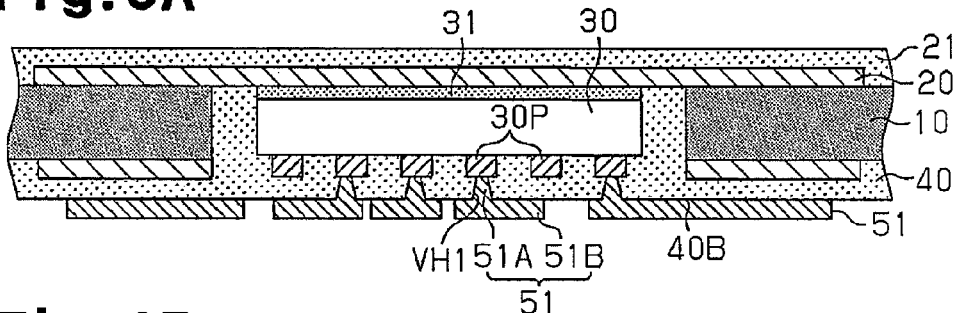

Next, in a step illustrated in FIG. 6A, a via conductor is filled in the via hole VH1 of the insulating layer 40 to form the via wire 51A, and the wiring pattern 51B electrically connected to the electrode terminal 30P through the via wire 51A is formed on the lower surface 40B of the insulating layer 40. The via wire 51A and the wiring pattern 51B, that is, the first wiring layer 51, can be formed by various wiring methods such as a semi-additive method and a subtractive method.

Figure 6B:
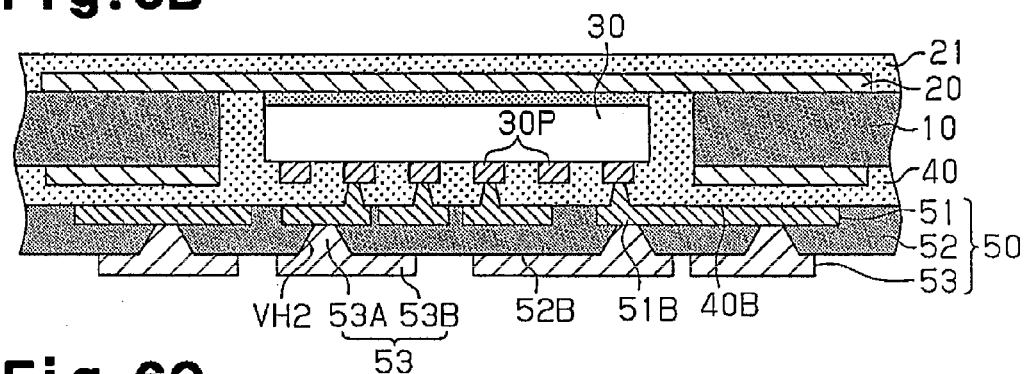

Next, in a step illustrated in FIG. 6B, the interlayer insulating layer 52 is formed on the lower surface 40B of the insulating layer 40 so as to cover the wiring pattern 51B, and the via hole VH2 reaching the upper surface of the wiring pattern 51B is formed in the interlayer insulating layer 52. For example, the interlayer insulating layer 52 can be formed by laminating a resin film on the lower surface 40B of the insulating layer 40 and then, heating the resin film at about 170 to 190° C. while pressing, to harden the film. The via hole VH2 can be formed by laser processing or photolithography.

Subsequently, a via conductor is filled in the via hole VH2 of the interlayer insulating layer 52 to form the via wire 53A, and the wiring pattern 53B electrically connected to the wiring pattern 51B via the via wire 53A is formed on a lower surface 52B of the interlayer insulating layer 52. The via wire 53A and the wiring pattern 53B, that is, the second wiring layer 53, can be formed by various wiring methods such as the semi-additive method and the subtractive method. Thereby, the wiring structure 50 having the first wiring layer 51, the interlayer insulating layer 52, and the second wiring layer 53 is formed on the lower surface 40B of the insulating layer 40.

Figure 6C:
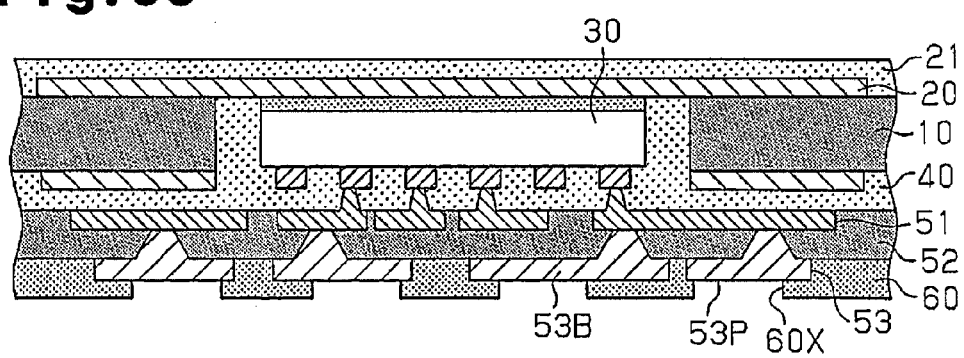

Subsequently, in a step illustrated in FIG. 6C, the solder resist layer 60 having the opening 60X that exposes a portion of the second wiring layer 53 (wiring pattern 53B) is staked on the lower surface 52B of the interlayer insulating layer 52. The solder resist layer 60 can be formed, for example, by laminating a photosensitive solder resist film or applying a liquid solder resist, and patterning the resist into a required shape. Thereby, a portion of the wiring pattern 53B as the external connection pad 53P is exposed from the opening 60X of the solder resist layer 60. As needed, a metal layer in which a Ni layer and an Au layer are stacked in this order may be formed on the external connection pad 53P. The metal layer can be formed by electroless plating.

Figure 6D:
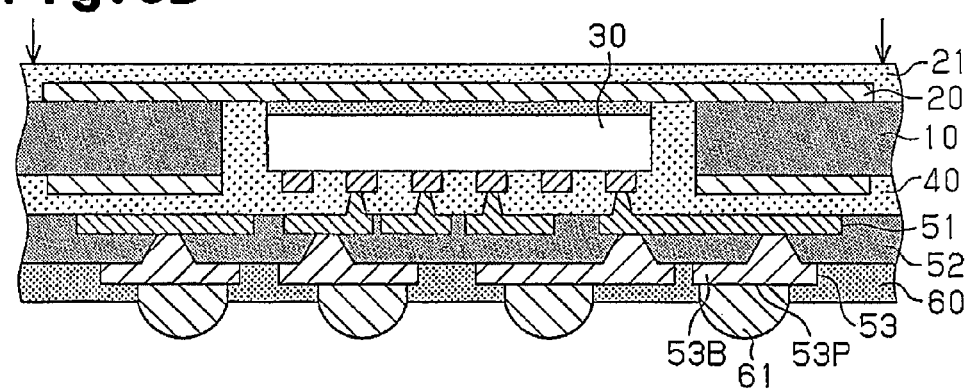

Next, in a step illustrated in FIG. 6D, the external connection terminal 61 is formed on the external connection pad 53P. For example, a flux is appropriately applied to the external connection pad 53P and then, the external connection terminal 61 (for example, solder ball) is mounted thereon, and is reflowed in the range of about 240 to 260° C. to be fixed thereon.

After that, the semiconductor package 1 illustrated in FIG. 1 can be obtained by cutting the structure illustrated in FIG. 6D into regions corresponding to individual semiconductor packages 1 (refer to arrows in this figure).

(Modelling Result)

Next, there will be described results on calculation for finding the amount of warp in the semiconductor package 1 in the case where the thickness of the metal plate 20 is varied. However, for simplifying a model, the core substrate 10 was changed to an insulating layer made of an insulating resin of the same composition as that of the insulating layer 40, and the conductive layer 22, the solder resist layer 60, and the external connection terminal 61 was omitted.

First, the semiconductor package 1 was dimensioned to be 8 mm×8 mm in a plan view, the semiconductor chip 30 was dimensioned to be 5 mm×5 mm in the plan view, the thickness of the semiconductor chip 30 was set to 100 μm (bonding member 31: 10 μm, the semiconductor chip 30: 75 μm, and the electrode terminal 30P: 15 μm), and the metal plate 20 and the insulating layer 21 was provided on the lower surface of the semiconductor chip 30. In this model, the thickness of the insulating layer 21 was set to 25 μm, the thickness from the lower surface 20B of the metal plate 20 to the lower surface 10B of the core substrate 10 was set to 95 μm, and the thickness from the lower surface 10B of the core substrate 10 to the lower surface 40B of the insulating layer 40 was set to 30 μm. In the model, the thickness of each of the wiring patterns 51B and 53B was set to 15 μm, the thickness of the interlayer insulating layer 52 was set to 30 μm, the physical values of the metal plate 20 and the wiring patterns 51B and 53B were set to be identical, and the physical values of the core substrate 10, the insulating layer 21, and the insulating layer 40 were set to be identical. In the state where the physical values of the metal plate 20, the semiconductor chip 30, the core substrate 10, the insulating layers 21 and 40, and the wiring structure 50 are fixed, the amount of warp was calculated while varying the thickness of the metal plate 20 to 18 μm, 35 μm, and 70 μm. Calculation results on the warp amount are summarized in Table 1.

TABLE 1

| Thickness of metal plate 20 (μm) | Warp (μm) |
|---|---|
| 18 | 178 |
| 35 | 124 |
| 70 | 144 |

As apparent from Table 1, given that the thickness of the metal plate 20 is 35 μm, warp in the semiconductor package 1 can be minimized. The reason can be inferred as follows.

In the model, the total thickness of the wiring layer (wiring patterns 51B and 53B) formed below the circuit formation surface 30B of the semiconductor chip 30 becomes 30 (=15+15) μm. By setting the thickness of the metal plate 20 formed above the surface opposite to the circuit formation surface 30B of the semiconductor chip 30, to 35 μm, distribution of physical values with respect to the semiconductor chip 30 when the semiconductor package 1 is vertically viewed becomes most vertically symmetrical among the three calculated values. Thus, it is deemed that the amount of warp is the smallest when the thickness of the metal plate 20 is 35 μm. Based on the above-mentioned results and consideration, it is deemed that warp of the semiconductor package 1 can be effectively reduced by making the thickness of the metal plate 20 closer to the total thickness of all wiring layers (for example, wiring patterns 51B and 53B) in the wiring structure 50.

The first embodiment can achieve following effects.

(1) The metal plate 20 and the insulating layer 21 are formed on the opposite side to the wiring structure 50 with respect to the semiconductor chip 30 and the core substrate 10 having a high mechanical strength. As a result, distribution of the thermal expansion coefficient and elastic modulus when the semiconductor package 1 is vertically viewed becomes vertically symmetrical with respect to the semiconductor chip 30 and the core substrate 10. Accordingly, vertical balance of the thermal expansion coefficient and elastic modulus with respect to the semiconductor chip 30 and the core substrate 10 is suitable, reducing warp in the semiconductor package 1 due to thermal contraction and the like.

Warp of the semiconductor package can be reduced by providing the thick metal plate of about 0.5 to 1 mm in place of the metal plate 20 and the insulating layer 21 on the upper surface of the semiconductor chip 30 to increase the mechanical strength of the entire semiconductor package. In this case, however, the thick metal plate disadvantageously inhibits reduction of the thickness of the semiconductor package 1.

Since the semiconductor package 1 in the first embodiment adopts the metal plate 20 thinner than the semiconductor chip 30, an increase in size of the semiconductor package 1 can be suppressed while reducing warp in the semiconductor package 1. By providing the core substrate 10 made of the reinforcement-containing insulating resin, the mechanical strength of the entire semiconductor package 1 can be increased to reduce warp in the semiconductor package 1. Further, since the core substrate 10 and the semiconductor chip 30 are formed on the same plane, and the semiconductor chip 30 is housed in the opening 10X of the core substrate 10, an increase in size of the semiconductor package 1 due to provision of the core substrate 10 can be suppressed.

When the total thickness of the wiring layers in the wiring structure 50 is larger than the thickness of the semiconductor chip 30, symmetry of distribution of physical values with respect to the semiconductor chip 30 is degraded. However, by providing the metal plate 20 and the insulating layer 21, as compared to the case where the layers are not provided, distribution of physical values with respect to the semiconductor chip 30 becomes further vertically symmetrical, reducing warp in the semiconductor package 1.

(2) The core substrate 10 is formed to have the thickness larger than the total thickness of the semiconductor chip 30 and the bonding member 31. Thus, variation in the thickness of the insulating layer 40 that covers the circuit formation surface 30B of the semiconductor chip 30 can be reduced, thereby making the lower surface 40B of the insulating layer 40 flat.

(3) Since the entire metal plate 20 is covered by the care substrate 10 and the insulating layers 21 and 40, oxidation of the metal plate 20 is suppressed. Therefore, decrease in heat conductivity due to oxidation of the metal plate 20 can be suitably suppressed.

(4) The metal layer 70 formed on the upper surface 10A of the core substrate 10 is patterned to form the metal plate 20, a required site of the core substrate 10 is removed to form the opening 10X that exposes the lower surface 20B of the metal plate 20, and the semiconductor chip 30 is mounted in the housing portion defined by the metal plate 20 and the opening 10X. Further, the insulating layers 21 and 40 are formed on both upper and lower surfaces of the core substrate 10, and the wiring structure 50 is formed on the lower surface 40B of the insulating layer 40. In this manner, the semiconductor package 1 is manufactured by processing the core substrate 10 having a high mechanical strength and the metal layer 70 formed on the core substrate 10 and forming the insulating layer and the wiring layer on both upper and lower surfaces of the core substrate 10. According to such manufacturing method, a sufficient mechanical strength of the structure in the manufacturing process can be ensured by the core substrate 10. Thus, the support substrate used according to the conventional manufacturing method, that is, the support substrate required to ensure the mechanical strength of the structure in the manufacturing process can be omitted. Since such support substrate is finally removed from the semiconductor package 1, manufacturing costs can be reduced by omitting the support substrate.

(5) The thermal expansion coefficient of the outermost interlayer insulating layer 52 on the opposite side to the insulating layer 21 is set to closer to the thermal expansion coefficient of the semiconductor chip 30 than the thermal expansion coefficient of the insulating layers 21 and 40. Thus, the contraction amount generated below the semiconductor chip 30 (on the side of the wiring structure 50) at cooling after heat treatment can be made close to the contraction amount generated on the side of the semiconductor chip 30 (the semiconductor chip 30, the core substrate 10, the metal plate 20, the insulating layer 21, and the like). Accordingly, warp in the semiconductor package 1 can be reduced.

(6) The semiconductor chip 30 is bonded to the metal plate 20 via the bonding member 31. Thus, since the semiconductor chip 30 is thermally connected to the metal plate 20, heat generated in the semiconductor chip 30 can be efficiently radiated. The metal plate 20 can preferably protect the semiconductor chip 30 against electromagnetic waves.

(7) The conductive layer 22 is formed on the lower surface 10B of the core substrate 10. This can increase the stiffness of the structure in the manufacturing process. Since bending of the structure in transport through a belt conveyor in the manufacturing process can be reduced by providing the conductive layer 22, the structure can be conveyed more safely, improving conveyance of the structure in the manufacturing process.

Focusing on differences between the second embodiment and the first embodiment, the second embodiment will be described below with reference to FIG. 7 to FIG. 12. The same members as those in FIG. 1 to FIG. 6 are given the same reference numerals and detailed description thereof is omitted.

Figure 7:
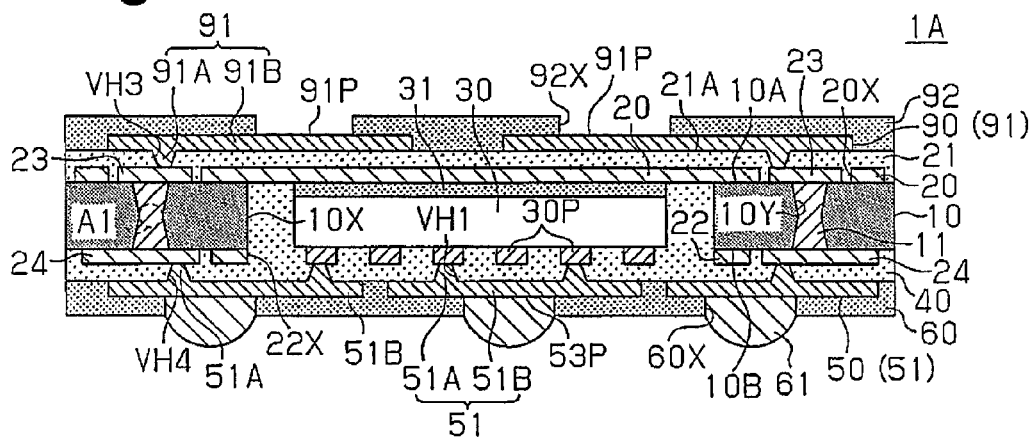
FIG. 7 is a schematic sectional view of a semiconductor package in accordance with the second embodiment.
Figure 8:
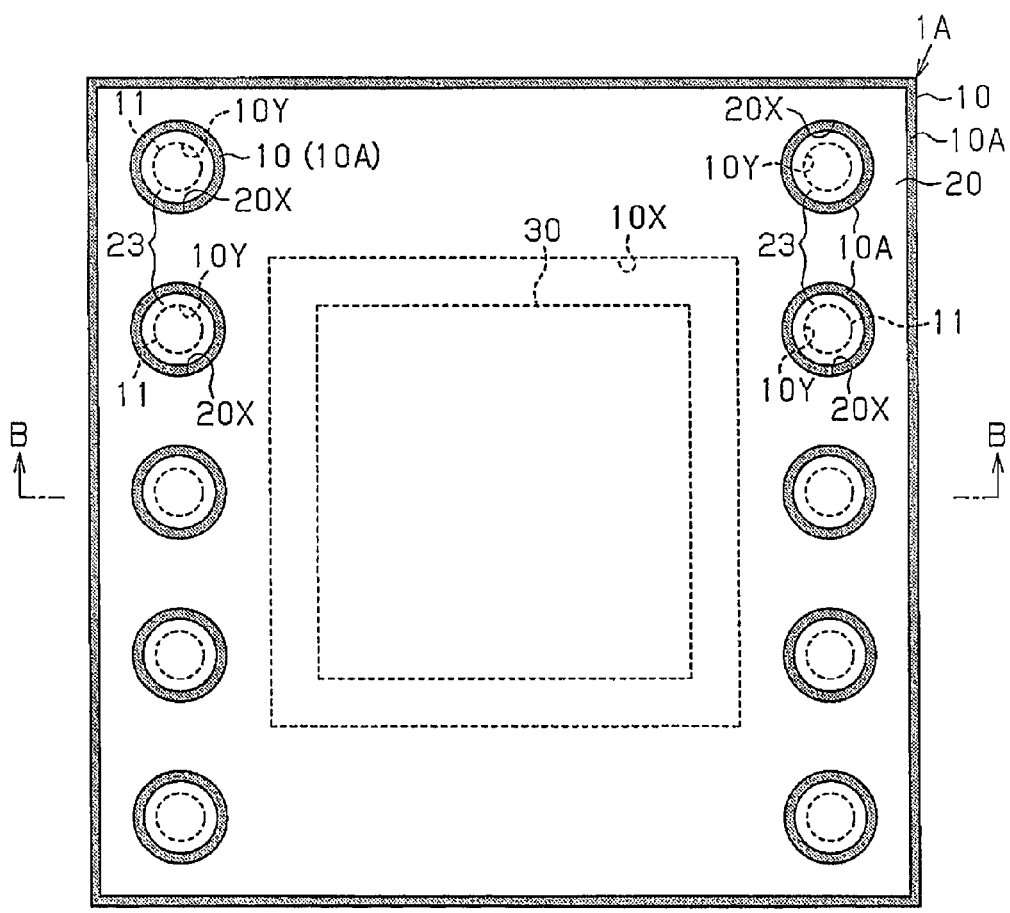
FIG. 8 is a schematic plan view illustrating the semiconductor package in FIG. 7 when viewed from above, omitting some members (an insulating layer and a wiring structure) of the semiconductor package.

FIG. 7 is a sectional view of a semiconductor package 1A taken along a line B-B in FIG. 8. The core substrate 10 of the semiconductor package 1A has the opening 10X as well as through holes 10Y at required positions (in FIG. 7, two positions around the opening 10X). For example, as illustrated in FIG. 8, the plurality of through holes 10Y are formed on the core substrate 10 along a pair of opposed sides (in FIG. 8, right and left sides) of four sides defining the outer shape of the semiconductor package 1A. Each of the through holes 10Y is circular in a plan view. As illustrated in FIG. 7, the through holes 10Y penetrate the core substrate 10 in the thickness direction. Accordingly, the through holes 10Y have their open ends on the upper surface 10A and the lower surface 10B of the core substrate 10. Each of the through holes 10Y is shaped like an hourglass in a sectional view such that a middle portion of each through hole 10Y in the depth direction has a narrowest portion A1 (where the inner diameter becomes smallest). For example, each through hole 10Y is shaped like the hourglass in the sectional view such that its opening diameter becomes larger from the middle position (narrowest portion A1) in the direction of thickness of the core substrate 10 toward both open ends. The diameter of the open end of each through hole 10Y may be set to about 50 to 100 μm.

A through electrode 11 penetrating the core substrate 10 in the thickness direction is formed in each of the through holes 10Y. The through electrodes 11 fill the through holes 10Y. The through electrode 11 is circular in a plan view, for example. Examples of the material for the through electrode 11 include copper and copper alloy.

The upper surface 10A of the core substrate 10 has the metal plate 20, and a wiring pattern 23 that is electrically separated from the metal plate 20 and electrically connected to one end of the through electrode 11. As illustrated in FIG. 8, the metal plate 20 substantially extends over the entire surface of the semiconductor package 1A (for example, the core substrate 10) except for its outer edge, and also extends on the circumference of the wiring pattern 23. The metal plate 20 exposes the outer edge of the upper surface 10A of the core substrate 10 and covers the upper surface 10A except for its outer edge. The metal plate 20 has substantially circular openings 20X in a plan view, which is larger than the wiring pattern 23 in a plan view, in a region where the wiring pattern 23 is formed. The substantially circular wiring pattern 23 in the plan view is formed in the opening 20X. Accordingly, the core substrate 10 is annularly exposed from the metal plate 20 and the wiring pattern 23, between the metal plate 20 and the wiring pattern 23. The metal plate 20 also covers one open end of the opening 10X (for example, the open end on the side of the upper surface 10A of the core substrate 10). When the material for the metal plate 20 is copper, the planar shape of the metal plate 20 is set such that the ratio of remaining copper in the metal plate 20 is in the range of about 50 to 95%. Examples of the material for the wiring pattern 23 include copper and copper alloy.

The insulating layer 21 covers the upper surface and side surfaces of the metal plate 20, the upper surface and side surfaces of the wiring pattern 23, and the upper surface 10A of the core substrate 10, which is exposed from the metal plate 20 and the wiring pattern 23. The insulating layer 21 fills space between the metal plate 20 and the wiring pattern 23. The insulating layer 21 has a via hole VH3 that penetrates the insulating layer 21 to expose the upper surface of the wiring pattern 23.

The insulating layer 21 has a wiring structure 90. The wiring structure 90 is formed by alternately stacking the wiring layer and the interlayer insulating layer. The number of the wiring layer may be any value, and the interlayer insulating layer may have a thickness that causes the wiring layers to be isolated from each other. However, in the example illustrated in FIG. 7, for convenience of description, the wiring structure 90 has only one wiring layer 91. For this reason, the wiring structure 90 in the second embodiment has no interlayer insulating layer. The wiring structure 90 is an example of a second wiring structure. The wiring layer 91 is an example of a second wiring layer.

The wiring layer 91 is stacked on the insulating layer 21. The wiring layer 91 is a topmost (outermost) wiring layer formed on the side of the upper surface 10A of the core substrate 10. The wiring layer 91 has a via wire 91A filled in the via hole VH1 and a wiring pattern 91B formed on the upper surface 21A of the insulating layer 21. The via wire 91A is electrically connected to the wiring pattern 23 exposed from the bottom of the via hole VH3, and is also electrically connected to the wiring pattern 91B. The via hole VH3 and the via wire 91A expand in diameter from the lower side (the side of the core substrate 10) toward the upper side (the side of the wiring pattern 91B) in FIG. 7, that is, are formed in a tapered shape. The via hole VH3 and the via wire 91A are circular in a plan view. The via hole VH3 and the via wire 91A each may have a diameter of about 20 to 65 μm. The wiring pattern 91B may have a thickness of about 15 to 35 μm. Examples of the material for the wiring layer 91 (the via wire 91A and the wiring pattern 91B) include copper and copper alloy.

A solder resist layer 92 is formed on the upper surface 21A of the insulating layer 21 so as to partially cover the wiring layer 91. The solder resist layer 92 has an opening 92X that exposes a portion of the wiring pattern 91B as a connection pad 91P. The connection pad 91P is electrically connected to another semiconductor package 3 or the like (refer to FIG. 9). The opening 92X and the connection pad 91P are arranged in a matrix or peripheral manner in a plan view. The opening 92X and the connection pad 91P each are circular in a plan view, for example, and may have a diameter of about 70 to 250 μm. The thickness from the upper surface 21A of the insulating layer 21 to the upper surface of the solder resist layer 92 may be about 20 to 40 μm. Examples of the material for the solder resist layer 92 include epoxy and acryl insulating resin.

The lower surface 10B of the core substrate 10 has the conductive layer 22, and a wiring pattern 24 that is electrically separated from the conductive layer 22 and electrically connected to the other end of the through electrode 11. Thus, the wiring pattern 24 and the wiring pattern 23 are electrically connected to each other via the through electrode 11. As described above, one surface (the side of the upper surface 10A) and the other surface (the side of the lower surface 10B) of the core substrate 10 are electrically connected to each other via the through electrode 11 penetrating the core substrate 10. Examples of the material for the wiring pattern 24 include copper and copper alloy.

The insulating layer 40 covers the lower surface and side surfaces of the conductive layer 22, the lower surface and side surfaces of the wiring pattern 24, and the lower surface 10B of the core substrate 10, which is exposed from the conductive layer 22 and the wiring pattern 24. The insulating layer 40 fills space between the conductive layer 22 and the wiring pattern 24, as well as the opening 10X of the core substrate 10 and the opening 22X of the conductive layer 22. The insulating layer 40 has the via hole VH1, and a via hole VH4 that penetrates the insulating layer 40 to expose the lower surface of the wiring pattern 24.

A wiring structure 50 in the second embodiment does not have the interlayer insulating layer 52 and the second wiring layer 53 in the wiring structure 50 in the first embodiment, that is, has only the first wiring layer 51. The first wiring layer 51 is a bottommost (outermost) wiring layer formed on the side of the lower surface 10B of the core substrate 10. The first wiring layer 51 has the via wire 51A filled in the via holes VH1 and VH4, and the wiring pattern 51B formed on the lower surface of the insulating layer 40. The wiring pattern 51B is electrically connected to the electrode terminal 30P through the via wire 51A filled in the via hole VH1, and is electrically connected to the wiring pattern 91B through the via wire 51A filled in the via hole VH4, the wiring pattern 24, the through electrode 11, the wiring pattern 23, and the via wire 91A. The wiring pattern 23 is an example of a first wiring pattern. The wiring pattern 24 is an example of a second wiring pattern.

The solder resist layer 60 is formed on the insulating layer 40 so as to partially cover the first wiring layer 51. The solder resist layer 60 has the opening 60X to expose a portion of the wiring pattern 51B as the external connection pad 53P.

Figure 9:
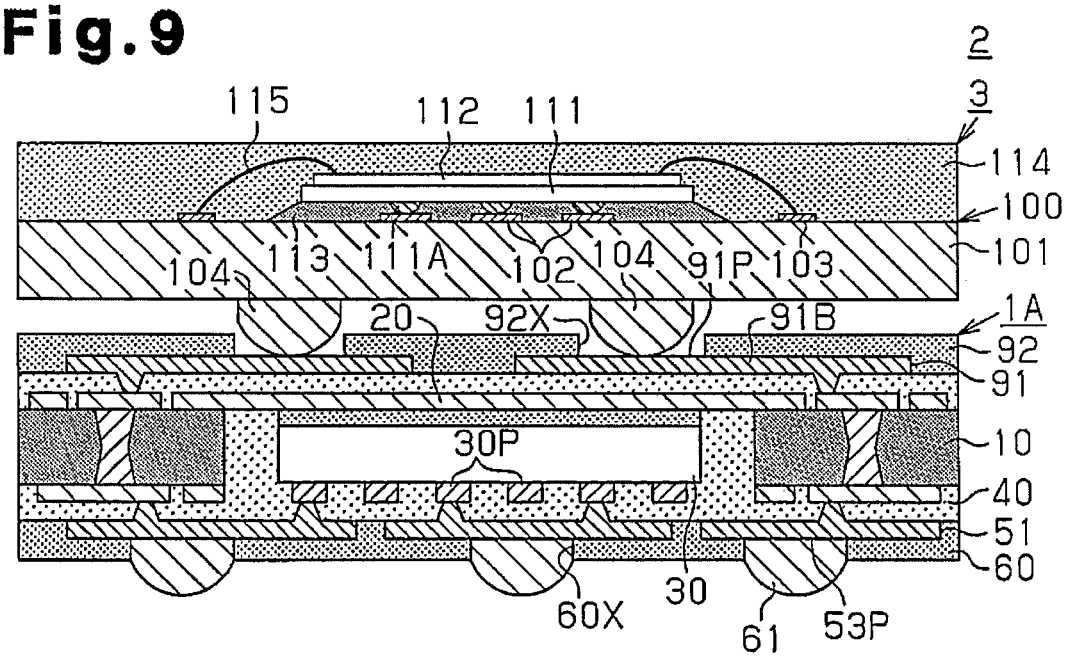
FIG. 9 is a schematic sectional view illustrating a semiconductor device in accordance with the second embodiment.

As illustrated in FIG. 9, a semiconductor device 2 has the semiconductor package 1A and the semiconductor package 3 stacked on and bonded to the semiconductor package 1A.

The semiconductor package 3 has a wiring board 100, a first semiconductor chip 111 flip-chip bonded to the wiring board 100, and a second semiconductor chip 112 adhered to the first semiconductor chip 111. The semiconductor package 3 has an underfill resin 113 that fills a gap between the first semiconductor chip 111 and the wiring board 100, and the sealing resin 114 that seals the first semiconductor chip 111 and the second semiconductor chip 112. The first semiconductor chip 111 is larger than the second semiconductor chip 112 in a plan view.

The wiring board 100 has a substrate body 101, a flip-chip pad 102 and a bonding pad 103 on the upper surface of the substrate body 101, and an external connection terminal 104 on the lower surface of the substrate body 101.

Although not illustrated, the substrate body 101 is configured of a plurality of insulating layers, and vias and wiring layers that are formed on the plurality of insulating layer. The vias and wiring layers provided in the substrate body 101 electrically connect the flip-chip pad 102, the bonding pad 103, and the external connection terminal 104. For example, a coreless substrate or a build-up substrate with a core, which has a core substrate can be used as the substrate body 101.

A bump 111A of the first semiconductor chip 111 is flip-chip bonded to the flip-chip pad 102. The bonding pad 103 is electrically connected to the electrode pad (not illustrated) formed on the upper surface of the second semiconductor chip 112 via the bonding wire 115. Examples of the materials for the flip-chip pad 102 and the bonding pad 103 include copper and copper alloy. The flip-chip pad 102 and the bonding pad 103 may be formed by applying a metal layer (for example, an Au layer, a Ni/Au layer, or a Ni/Pd/Au layer) to a surface of a copper layer.

The external connection terminal 104 is a connection terminal (for example, solder ball and lead pin) for connecting the semiconductor packages 1 and 3 to each other. Each external connection terminal 104 is provided to face the corresponding connection pad 91P of the semiconductor package 1A.

The underfill resin 113 is a resin for increasing the connection strength of a connection part between the bump 111A of the first semiconductor chip 111 and the flip-chip pad 102, and fills the gap between the upper surface of the wiring board 100 and the lower surface of the first semiconductor chip 111. Examples of the material for the underfill resin 113 include epoxy insulating resin.

The sealing resin 114 is provided on the upper surface of the substrate body 101 so as to seal the first semiconductor chip 111, the second semiconductor chip 112, the bonding wire 115, and the bonding pad 103. Examples of the material for the sealing resin 114 include insulating resins such as epoxy resin. A transfer molding can be used as the sealing method, for example.

In the semiconductor device 2, the external connection terminal 104 formed on the lower surface of the semiconductor package 3 is stacked on and bonded to the connection pad 91P formed on the upper surface of the semiconductor package 1A. Thereby, the semiconductor package 1A is bonded to the semiconductor package 3 to form the semiconductor device 2 having a POP (Package on Package) structure.

Next, a method of manufacturing the semiconductor package 1A will be described. Although one enlarged semiconductor package will be described below, in fact, a member that will become a plurality of semiconductor packages 1A is manufactured on one substrate and then, the member is separated into individual semiconductor packages 1A.

Figure 10A:
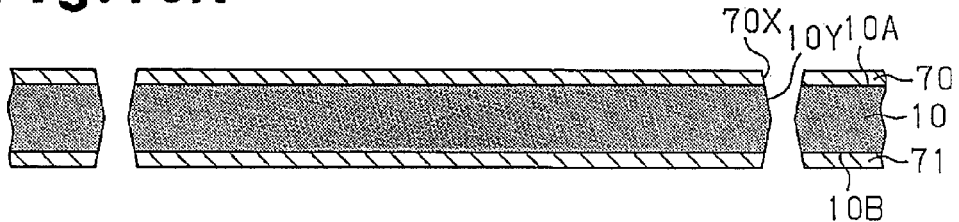
FIGS. 10A to 10E, FIGS. 11A to 11D, and FIGS. 12A, 12B are schematic sectional views illustrating a method of manufacturing the semiconductor package in accordance with the second embodiment.

As illustrated in FIG. 10A, first, the metal layer 70 that is a base material for the metal plate 20 and the wiring pattern 23 is adhered to the upper surface 10A of the core substrate 10, and the metal layer 71 that is a base material for the conductive layer 22 and the wiring pattern 24 is adhered to the lower surface 10B to prepare a copper clad laminated (CCL). In the illustrated example, a large substrate for many semiconductor packages 1A is used as the core substrate 10.

Subsequently, a through hole 70X penetrating the core substrate 10 and the metal layers 70 and 71 in the thickness direction is formed at a required position of the copper clad laminated. The through hole 70X can be formed by laser processing, mechanical drilling or the like. The through hole 70X in the second embodiment is formed from both of the upper surface 10A and the lower surface 10B of the core substrate 10 by laser processing. Thereby, as illustrated in FIG. 10A, it is possible to the through hole 70X shaped like an hourglass in a sectional view, in which the narrowest portion is formed in the middle of the core substrate 10 and the metal layers 70 and 71 in the thickness direction. A portion of the through hole 70X, in particular, a portion penetrating the core substrate 10 constitutes the through holes 10Y. When the through hole 70X is formed by laser processing, desmear is performed to remove resin smears in the through hole 70X. The desmear can be performed by using permanganate.

Figure 10B:
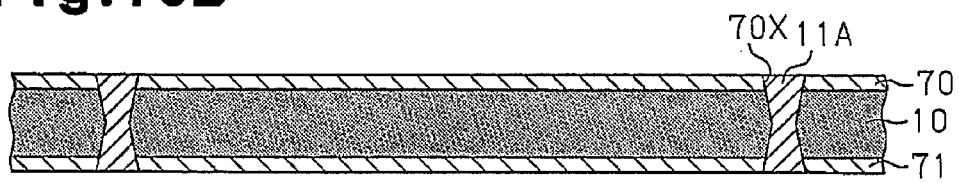

Next, in a step illustrated in FIG. 10B, the conductive layer 11A is formed in the through hole 70X. The conductive layer 11A is connected to the metal layer 70 on the side of the upper surface, and is connected to the metal layer 71 on the side of the lower surface. The conductive layer 11A that fills the through hole 70X can be formed by electrolytic plating (such as electrolytic copper plating) using a seed layer formed by sputtering as a power-feeding layer. The conductive layer 11A can be formed by embedding conductive paste, molten metal, or metal wire in the through hole 70X. It is preferable that one of the end surfaces of the conductive layer 11A is substantially flushed with the upper surface of the metal layer 70 and/or the other of the end surfaces of the conductive layer 11A is substantially flushed with the lower surface of the metal layer 71.

Subsequently, in a step illustrated in FIG. 10C, a resist layer 81 having an opening 81X is formed on the upper surface of the metal layer 70, and a resist layer 82 having an opening 82X is formed on the lower surface 10D of the metal layer 71. The opening 81X is formed so as to expose the metal layer 70 except for regions where the metal plate 20 and the wiring pattern 23 in FIG. 7 are formed. The opening 82X is formed so as to expose the metal layer 71 except for the regions where the conductive layer 22 and the wiring pattern 24 in FIG. 7 are formed. The resist layers 81 and 82 may be made of the same material as the material for the resist layers 72 and 73.

Next, using the resist layers 81 and 82 as etching masks, the metal layers 70 and 71 are etched. The metal layers 70 and 71 exposed from the openings 81X and 82X of the resist layers 81 and 82, respectively, are etched to pattern the metal layers 70 and 71 into a predetermined shape. By removing the metal layer 70 exposed from the opening 81X of the resist layer 81, as illustrated in FIG. 10O, the metal plate 20 and the conductive layer 23A are formed on the upper surface 10A of the core substrate 10. Through such patterning, the outer dimension of the metal plate 20 becomes smaller than that of the core substrate 10, and the metal plate 20 and the conductive layer 23A are electrically separated from each other. The conductive layer 22 and the conductive layer 24A are formed on the lower surface 10B of the core substrate 10 by removing the metal layer 71 exposed from the opening 82X of the resist layer 82. Through such patterning, the conductive layer 22 and the conductive layer 24A are electrically separated from each other. The conductive layer 23A and the conductive layer 11A connected to the side surface of the conductive layer 23A constitute the wiring pattern 23, and the conductive layer 24A and the conductive layer 11A connected to the side surface of the conductive layer 24A constitute the wiring pattern 24. The conductive layer 11A formed in the through holes 10Y constitutes the through electrode 11. After completion of such patterning of the metal layers 70 and 71, the resist layers 81 and 82 illustrated in FIG. 10O are removed by using an alkaline stripping agent.

Figure 10C:
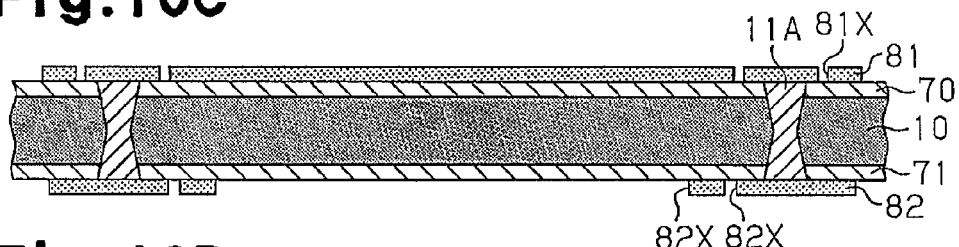
Figure 10D:
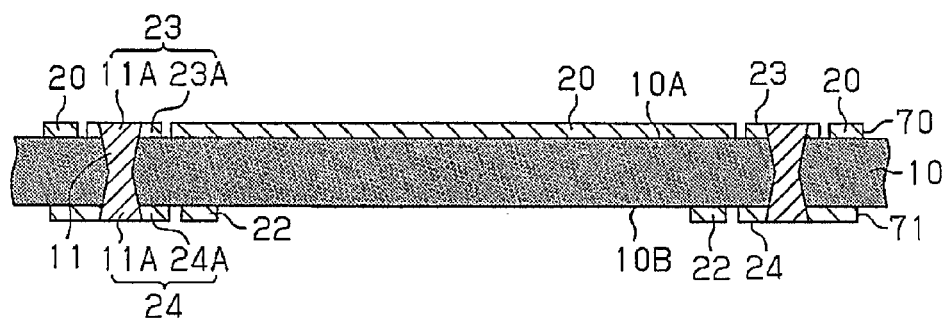
Figure 10E:
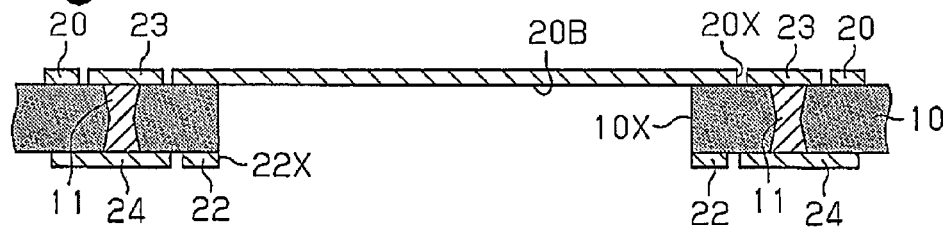

Next, in steps illustrated in FIG. 10D and FIG. 10E, according to the same manufacturing steps as the steps illustrated in FIG. 4A to FIG. 4C, the opening 10X is formed at a required position of the core substrate 10. In a preferred example of FIG. 10D, both end surfaces of the through electrode 11 are substantially flushed with the upper surface of the wiring pattern 23 and the lower surface of the wiring pattern 24, respectively. One of or both of the end surfaces of the through electrode 11 may be covered by the corresponding wiring patterns 23 and 24 as illustrated in FIG. 10E.

Figure 11A:
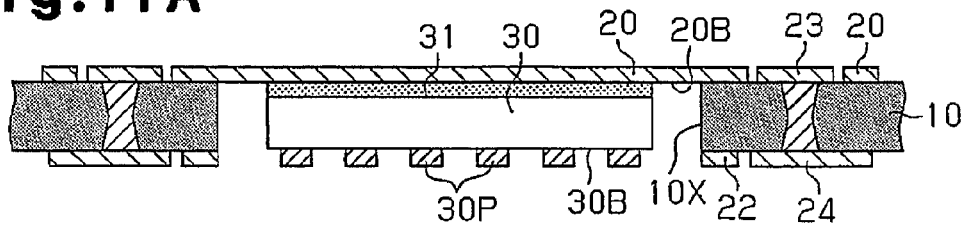

Subsequently, in a step illustrated in FIG. 11A, the semiconductor chip 30 is bonded to the lower surface 20B via the bonding member 31 such that the surface of the semiconductor chip 30 opposite to the circuit formation surface 30B faces the lower surface 20B of the metal plate 20, that is, the face-up state.

Figure 11B:
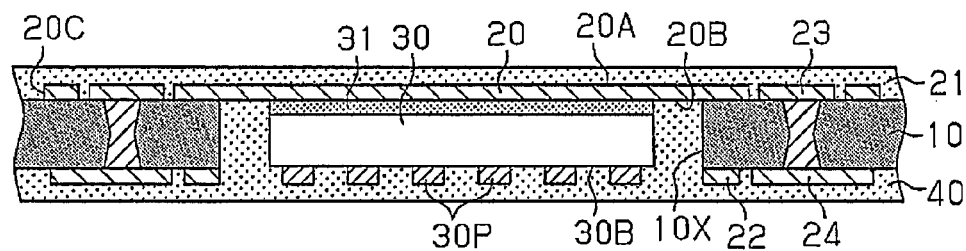

Next, in a step illustrated in FIG. 11B, according to the same manufacturing steps as the steps illustrated in FIGS. 5A and 5B, the insulating layer 21 that covers the metal plate 20 and the wiring pattern 23 is formed on the upper surface 10A of the core substrate 10, and the insulating layer 40 that covers the semiconductor chip 30, the conductive layer 22, and the wiring pattern 24 is formed on the side of the lower surface 20B of the metal plate 20.

Figure 11C:
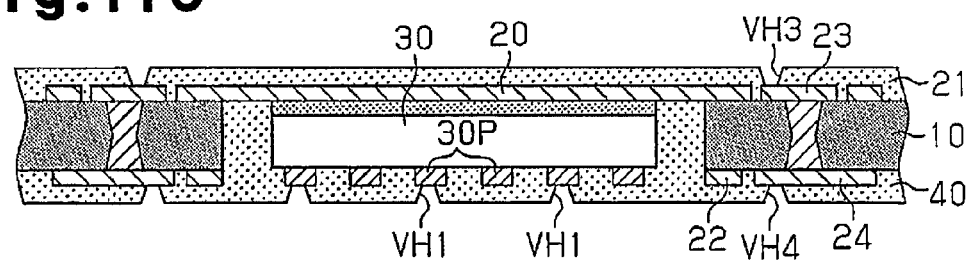

Next, in a step illustrated in FIG. 11C, the via hole VH1 is formed in the insulating layer 40 so as to expose a portion of the lower surface of the electrode terminal 30P, and the via hole VH4 is formed in the insulating layer 40 so as to expose a portion of the lower surface of the wiring pattern 24. The via hole VH3 is formed in the insulating layer 21 so as to expose a portion of the upper surface of the wiring pattern 23. These via holes VH1, VH3, and VH4 can be formed by laser processing or photolithography. When the via holes VH1, VH3, and VH4 are formed by laser processing, desmear is performed to remove resin smears in the via holes VH1, VH3, and VH4.

Figure 11D:
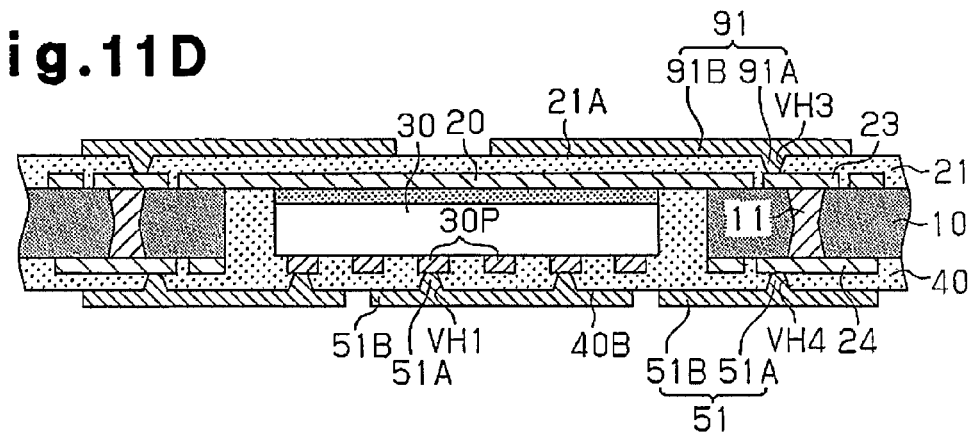

Subsequently, in a step illustrated in FIG. 11D, a via conductor fills the via holes VH1 and VH4 of the insulating layer 40 to form the via wire 51A, and the wiring pattern 51B electrically connected to the electrode terminal 30P or the wiring pattern 24 via the via wire 51A is formed on the lower surface 40B of the insulating layer 40. A via conductor fills the via hole VH3 of the insulating layer 21 to form the via wire 91A, and the wiring pattern 91B electrically connected to the wiring pattern 23 via the via wire 91A is formed on the upper surface 21A of the insulating layer 21. The first wiring layer 51 (the via wire 51A and the wiring pattern 513) and the wiring layer 91 (the via wire 91A and the wiring pattern 91B) can be formed by various wiring methods including the semi-additive method and the subtractive method.

Figure 12A:
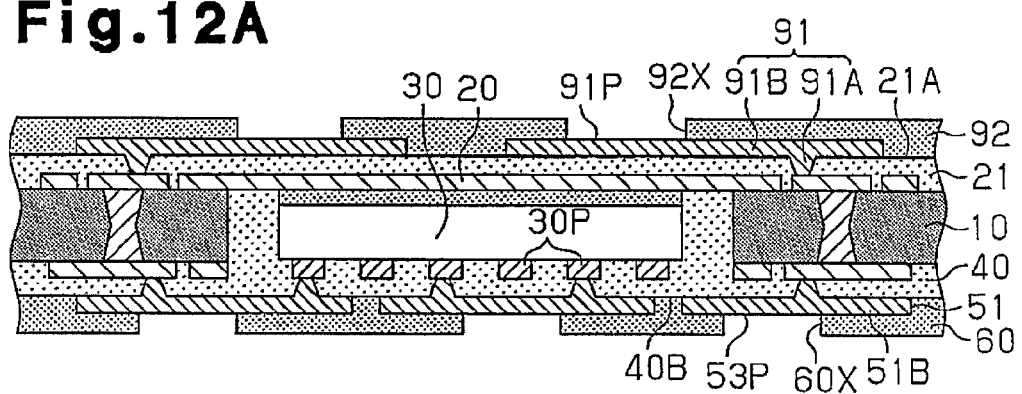

Subsequently, in a step illustrated in FIG. 12A, the solder resist layer 60 having the opening 60X that exposes a portion of the first wiring layer 51 (wiring pattern 513) is stacked on the lower surface 40B of the insulating layer 40. The solder resist layer 92 having the opening 92X that exposes a portion of the wiring layer 91 (wiring pattern 91B) is stacked on the upper surface 21A of the insulating layer 21. The solder resist layers 60 and 92 can be formed by laminating a photosensitive solder resist film or applying a liquid solder resist to pattern the resist into a required shape. Thereby, a portion of the wiring pattern 513, as the external connection pad 53P, is exposed from the opening 60X of the solder resist layer 60, and a portion of the wiring pattern 91B, as the connection pad 91P, is exposed from the opening 92X of the solder resist layer 92. As needed, a metal layer in which a Ni layer and an Au layer are stacked in this order may be formed on the external connection pad 53P and the connection pad 91P, or metal layer in which a Ni layer, a Pd layer, and an Au layer are stacked in this order may be formed on the external connection pad 53P and the connection pad 91P. The metal layers can be formed by using electroless plating.

Figure 12B:
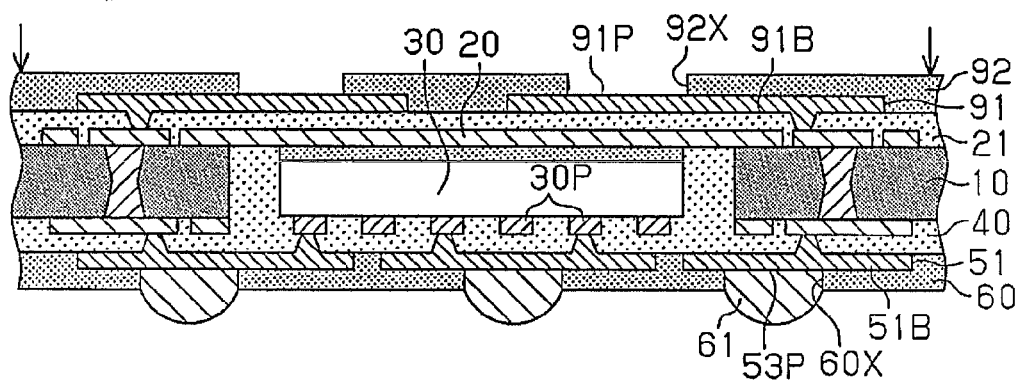

Next, in a step illustrated in FIG. 12B, the external connection terminal 61 is formed on the external connection pad 53P. After that, the semiconductor package 1A illustrated in FIG. 7 can be obtained by cutting the structure illustrated in FIG. 12B into regions corresponding to individual semiconductor packages 1A (refer to arrows in this figure).

Next, a method of manufacturing the semiconductor device 2 will be described.

Figure 12C:
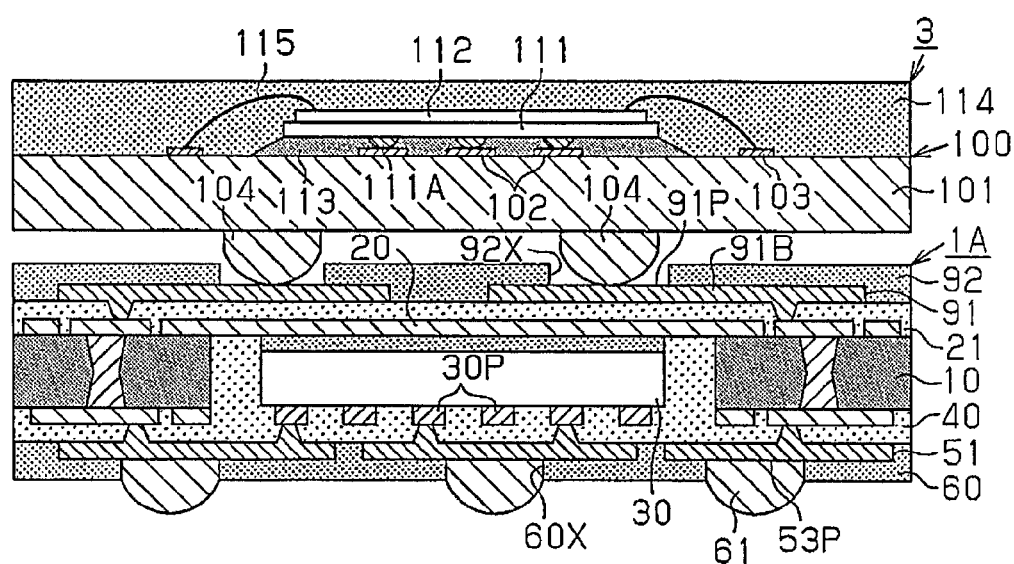
FIG. 12C is a schematic sectional view illustrating the method of manufacturing the semiconductor device in accordance with the second embodiment.

First, as illustrated in FIG. 12C, the semiconductor package 3 is prepared. Although not illustrated and not described in detail, the semiconductor package 3 is manufactured as follows. First, the wiring board 100 having the flip-chip pad 102, the bonding pad 103, and the external connection terminal 104 is formed, and the bump 111A of the first semiconductor chip 111 is flip-chip bonded to the flip-chip pad 102 formed on an upper surface of the wiring board 100. Subsequently, the underfill resin 113 is formed between the wiring board 100 and the first semiconductor chip 111 is formed and then, the second semiconductor chip 112 is adhered on the first semiconductor chip 111 with an adhesive. Next, an electrode pad (not illustrated) formed on an upper surface of the second semiconductor chip 112 is bonded to the bonding pad 103 formed on the upper surface of the wiring board 100 with a bonding wire 115 and then, the first and second semiconductor chips 111, 112 and the bonding wire 115 are sealed with a sealing resin 114.

Subsequently, the semiconductor packages 1A and 3 are positioned such that the external connection terminal 104 of the semiconductor package 3 faces the corresponding connection pad 91P of the semiconductor package 1A. In an example, a flux not illustrated is previously transferred to the external connection terminal 104 of the semiconductor package 3.

Next, when thus positioned semiconductor package 3 is mounted on the semiconductor package 1A, the structure is conveyed to a reflow furnace (not illustrated). Then, the external connection terminal 104 (for example, solder ball) is reflowed in the reflow furnace, and the semiconductor packages 1A and 3 are bonded to each other at the connection pad 91P. In this manner, the semiconductor device 2 having a POP structure illustrated in FIG. 9 is manufactured. The semiconductor package 1A achieves the same effects as those in the first embodiment. For example, warp in the semiconductor package 1A can be reduced to return the semiconductor package 1A into a flat state. Thereby, the semiconductor package 3 can be easily stacked on and bonded to the semiconductor package 1A.

The first and second embodiments may be appropriately modified as follows.

In the first and second embodiments, before forming the opening 10X in the core substrate 10, the insulating layer 21 that covers the metal plate 20 may be formed on the upper surface 10A of the core substrate 10. An example of the manufacturing method in this case will be described below. Although a modification example of the method of manufacturing the semiconductor package 1 in the first embodiment will be described, the method of manufacturing the semiconductor package 1 in the second embodiment can be modified in the same manner.

Figure 13A:
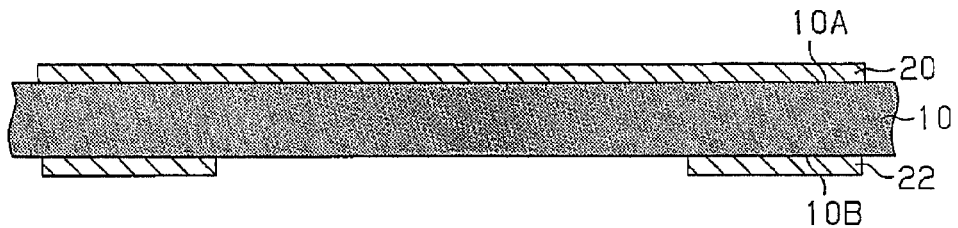
FIGS. 13A to 13D and FIGS. 14A to 14C are schematic sectional views illustrating a method of manufacturing a semiconductor package in a modification example.

In a step illustrated in FIG. 13A, according to the same manufacturing steps as FIG. 3A to FIG. 3D, the metal plate 20 is formed on the upper surface 10A of the core substrate 10, and the conductive layer 22 is formed on the lower surface 10B of the core substrate 10.

Figure 13B:
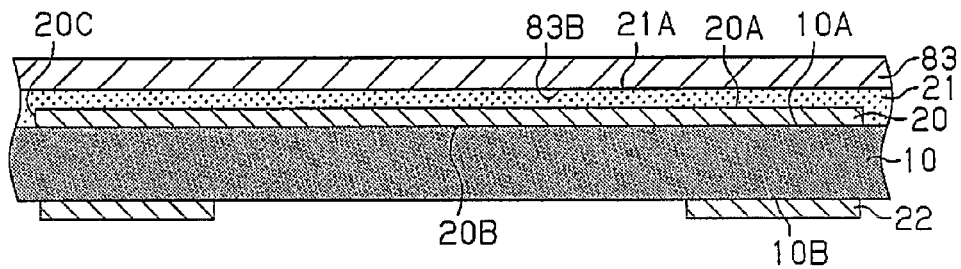

Next, in a step illustrated in FIG. 13B, according to the same manufacturing steps as the steps illustrated in FIGS. 5A and 5B, a structure in which a sheet-like insulating layer in a B-stage that becomes the insulating layer 21 is adhered on a lower surface 83B of a support body 83 is prepared, and the structure is laminated on the upper surface 10A of the core substrate 10 by thermocompression bonding and is subjected to thermosetting treatment. Thereby, the insulating layer 21 that covers the upper surface 20A and the side surfaces 20C of the metal plate 20 is formed on the upper surface 10A of the core substrate 10, and the support body 83 is formed on the upper surface 21A of the insulating layer 21 to cover the entire upper surface 21A. A copper foil may be used as the support body 83. The support body 83 may have a thickness of about 35 to 70 μm.

Figure 13C:
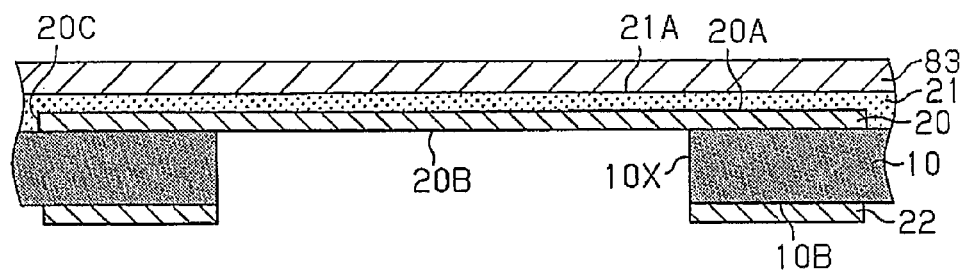

Subsequently, in a step illustrated in FIG. 13C, according to the same manufacturing steps as the steps illustrated in FIG. 4A to FIG. 4C, the opening 10X is formed at a required position of the core substrate 10. Thereby, the lower surface 20B of the metal plate 20 is exposed from the opening 10X. In this step, since the metal plate 20 is supported by the insulating layer 21 and the support body 83 (metal layer), mechanical damage of the metal plate 20 due to sandblasting and the like can be prevented. For example, in this step, the support body 83 functions as a protecting layer for protecting the upper surface 20A and the side surfaces 20C of the metal plate 20 and the upper surface 21A of the insulating layer 21 against sandblasting and the like.

Figure 13D:
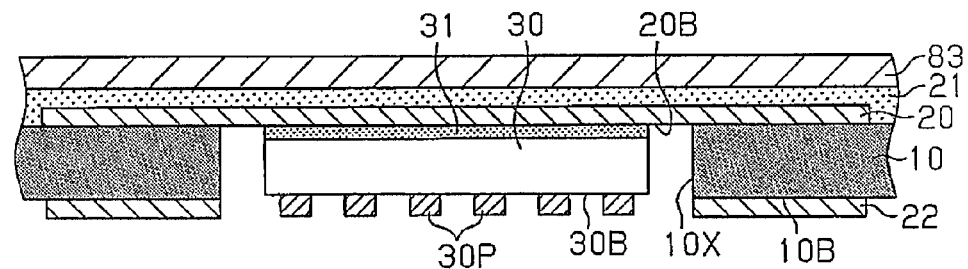

Next, in a step illustrated in FIG. 13D, the semiconductor chip 30 is bonded on the lower surface 20B via the bonding member 31 such that the surface of the semiconductor chip 30 opposite to the circuit formation surface 30B faces the lower surface 20B of the metal plate 20, that is, in the face-up state.

Figure 14A:
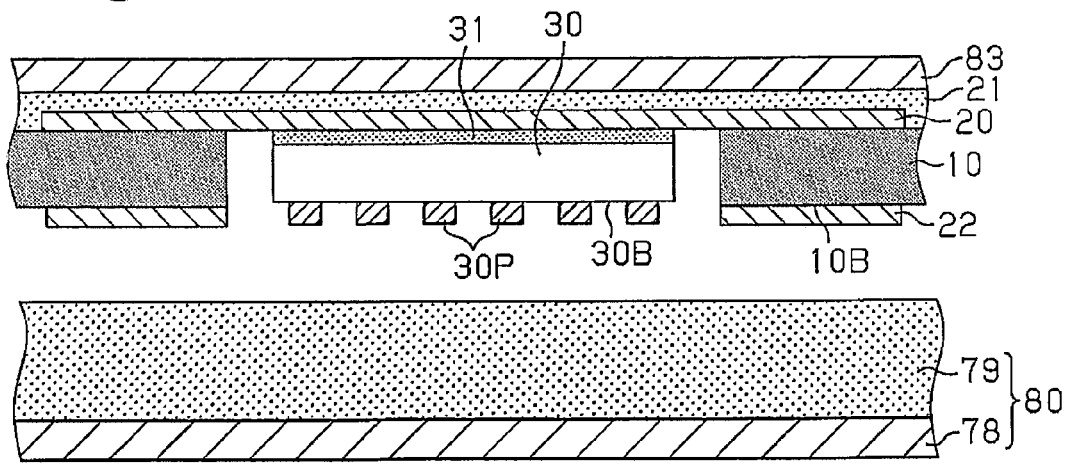
Figure 14B:
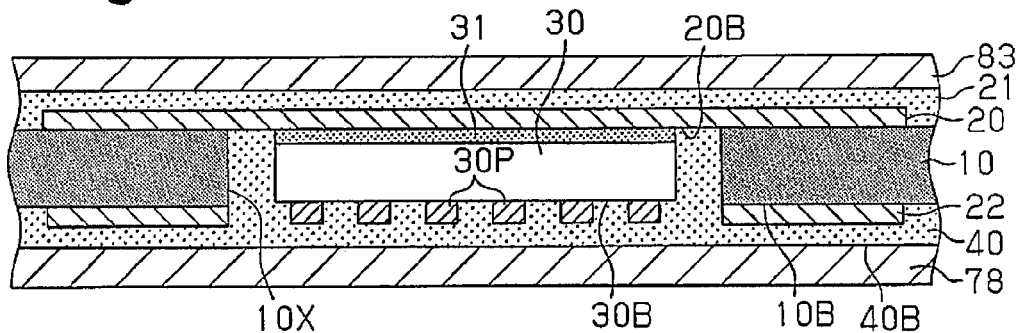

Next, in a step illustrated in FIG. 14A, according to the same step as the step illustrated in FIG. 5A, the structure 80 in which the sheet-like insulating layer 79 that becomes the insulating layer 40 is adhered to the carrier 78 is prepared, and the structure 80 is arranged on the side of the lower surface 10B of the core substrate 10. The structure 80 is arranged, with the insulating layer 79 facing upward, such that the insulating layer 79 faces the electrode terminal 30P of the semiconductor chip 30. Then, the structure 80 is laminated on the lower surface 10B of the core substrate 10 and the lower surface 20B of the metal plate 20 by thermocompression bonding, and is subjected to thermosetting treatment. Accordingly, as illustrated in FIG. 14B, the insulating layer 40 that fills the opening 10X and covers the semiconductor chip 30 and the like is formed on the lower surfaces 10B and 20B. The carrier 78 that covers the entire lower surface 40B is formed on the lower surface 40B of the insulating layer 40. In the steps illustrated in FIG. 14A and FIG. 14B, the carrier 78 may be omitted.

Figure 14C:
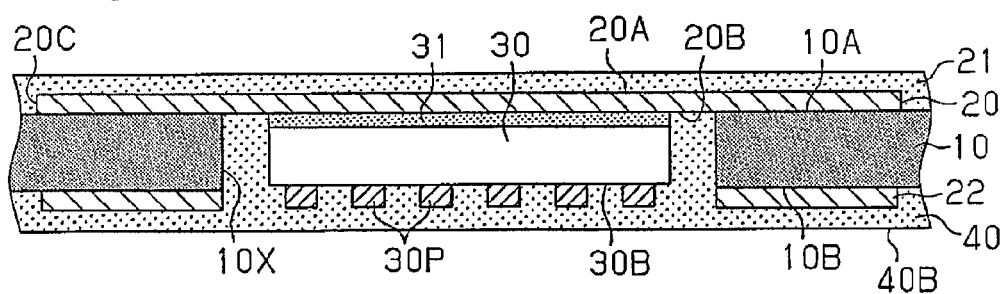

Subsequently, in a step illustrated in FIG. 14C, the carrier 78 and the support body 83 in FIG. 14B are selectively removed from the insulating layers 21 and 40. When the carrier 78 and the support body 83 are copper foil, the carrier 78 and the support body 83 can be selectively removed from the insulating layers 21 and 40 by wet etching using aqueous ferric chloride, aqueous cupric chloride, or aqueous ammonium persulfate. Thereby, the same structure as the structure illustrated in FIG. 5B can be obtained. After that, according to the same manufacturing steps as the steps illustrated in FIG. 5C to FIG. 6D, the semiconductor package 1A can be manufactured.

As described above, by stacking the insulating layer 21 and the support body 83 on the upper surface 10A of the core substrate 10 before formation of the opening 10X, when the opening 10X is formed, the upper surface 20A of the metal plate 20 and the upper surface 21A of the insulating layer 21 can be protected against sandblasting. Further, since the support body 83 is chemically removed by wet etching after formation of the opening 10X, it is possible to reduce mechanical damages of the upper surface 20A of the metal plate 20 and the upper surface 21A of the insulating layer 21 in the manufacturing process. The support body 83 can increase the mechanical strength of the structure in the manufacturing process.

The conductive layer 22 in the first embodiment may be omitted. In this case, the metal layer 71 formed on the lower surface 10B of the core substrate 10 may be omitted.

The conductive layer 22 in the second embodiment may be omitted.

Focusing on differences between the third embodiment and the second embodiment, the third embodiment will be described below with reference to FIG. 15 to FIG. 18. The same members as those in FIG. 1 to FIG. 14 are given the same reference numerals, and detailed description thereof is omitted.

Figure 15:
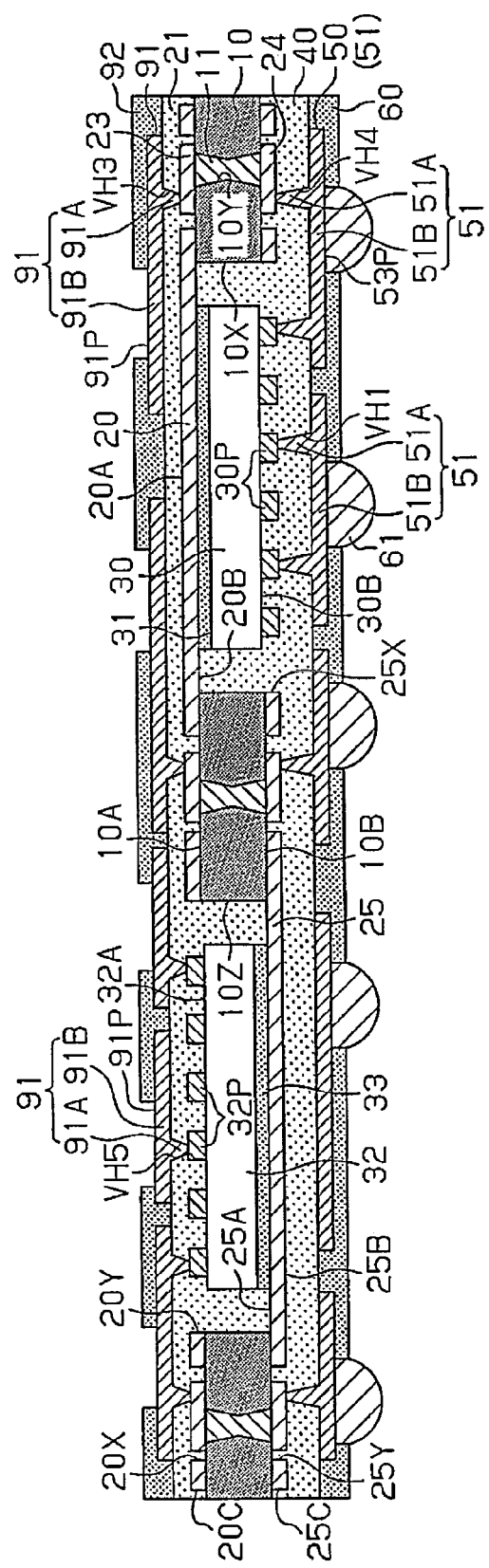
FIG. 15 is a schematic sectional view illustrating a semiconductor package in accordance with the third embodiment.
Figure 16A:
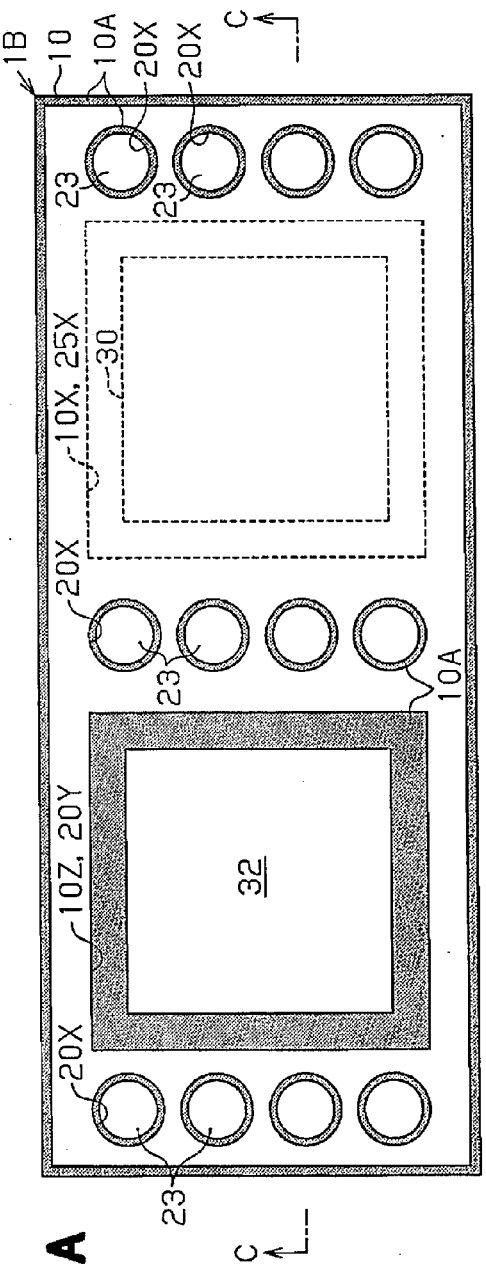
FIG. 16A is a schematic plan view illustrating the semiconductor package in FIG. 15 when viewed from above.

FIG. 15 illustrates a sectional structure of the semiconductor package 1B taken along a line C-C in FIG. 16A. The core substrate 10 of the semiconductor package 1B has a plurality of openings 10X and 10Z at required positions (for example, two). The openings 10X and 10Z are formed so as to penetrate the core substrate 10 from the upper surface 10A to the lower surface 10B. The openings 10X and 10Z are examples of first and second openings, respectively.

As illustrated in FIG. 16A, the opening 10X is formed in a right region of the core substrate 10, and at a position overlapping the semiconductor chip 30 in a plan view. Like the semiconductor chip 30, the opening 10X is rectangular in a plan view. The opening 10X is larger than the semiconductor chip 30 in the plan view. Thus, the semiconductor chip 30 is provided inner from the outer edge of the opening 10X in a plan view, that is, is housed in the opening 10X.

Figure 16B:
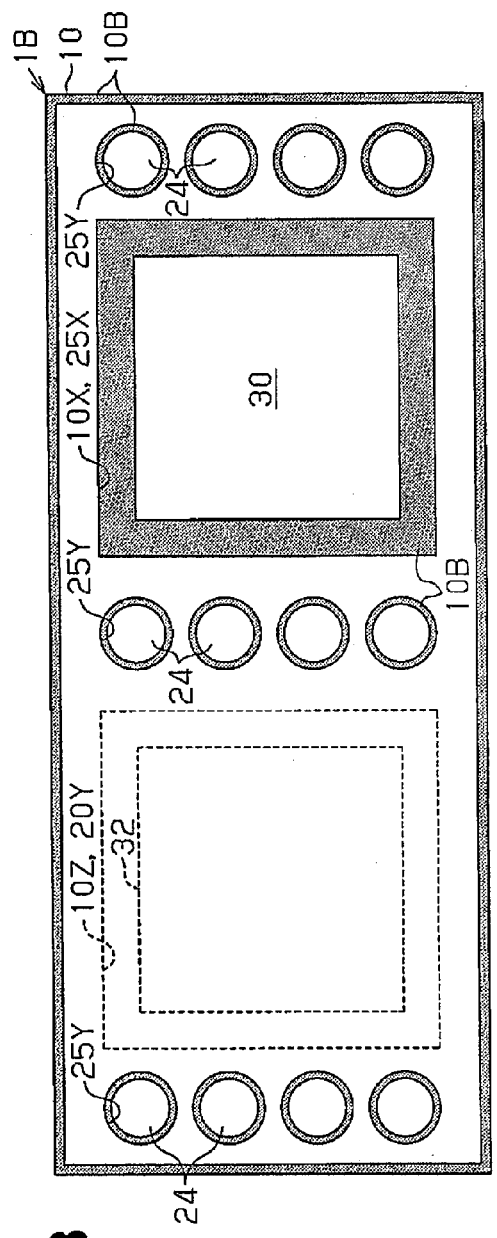
FIG. 16B is a schematic plan view illustrating the semiconductor package in FIG. 15 when viewed from below, and FIGS. 16A, 16B omit some members (an insulating layer and a wiring structure) of the semiconductor package.

FIG. 16A is a plan view of the semiconductor package 1B illustrated in FIG. 15 when viewed from the upper surface, and some members (the insulating layer 21, the wiring layer 91, and the solder resist layer 92) are not illustrated. FIG. 16B is a plan view of the semiconductor package 1B illustrated in FIG. 15 when viewed from the lower surface, and some members (the insulating layer 40, the first wiring layer 51, the solder resist layer 60, and the external connection terminal 61) are not illustrated.

The opening 10Z is formed in a left region in the core substrate 10 in a plan view, and at a position overlapping a semiconductor chip 32. Like the semiconductor chip 32, the opening 10Z is rectangular in a plan view. The opening 10Z is larger than the semiconductor chip 32 in the plan view. Accordingly, the semiconductor chip 32 is provided inner from the outer edge of the opening 10Z in a plan view, that is, is housed in the opening 10Z. The openings 10X and 10Z are dimensioned to be about 5 mm×5 mm to 15 mm×15 mm in a plan view. The semiconductor chip 30 is an example of a first electronic component. The semiconductor chip 32 is an example of a second electronic component.

As illustrated in FIG. 15, the core substrate 10 has the through holes 10Y at required positions (in FIG. 15, three positions around the openings 10X and 10Z). The through electrode 11 penetrating the core substrate 10 in the thickness direction is formed in each of the through holes 10Y.

In the illustrated example, the thickness of the core substrate 10 is substantially same as the thickness of the included (embedded) semiconductor chips 30 and 32. The core substrate 10 may have a thickness of about 50 to 200 μm.

The metal plate 20 is formed on the upper surface 10A of the core substrate 10. The wiring pattern 23 that is electrically separated from the metal plate 20 and is electrically connected to the through electrode 11 is formed on the upper surface 10A of the core substrate 10. For example, as illustrated in FIG. 16A, a plurality of wiring patterns 23 are formed on the upper surface 10A of the core substrate 10 along a pair of opposed sides (in FIG. 16A, left and right sides) among four sides defining the outer shape of the semiconductor package 1B. The plurality of wiring patterns 23 are formed on the upper surface 10A of the core substrate 10 along sides of the opposed openings 10X and 10Z in a region between the opening 10X and the opening 10Z. Each wiring pattern 23 is circular in a plan view, for example.

A metal plate 25 is formed on the lower surface 10B of the core substrate 10. The metal plate 25 has a first surface (upper surface in FIG. 15) 25A, a second surface (lower surface in FIG. 15) 25B, and side surfaces 25C. The wiring pattern 24 that is electrically separated from the metal plate 25 and is connected to the through electrode 11 is formed on the lower surface 10B of the core substrate 10. For example, as illustrated in FIG. 16B, a plurality of wiring pattern 24 are formed on the lower surface 10B of the core substrate 10 along a pair of opposed sides (in FIG. 16, left and right sides) among four sides defining the outer shape of the semiconductor package 1B. The plurality of wiring pattern 24 are formed on the lower surface 10B of the core substrate 10 along the opposed sides of the openings 10X and 10Z in a region between the opening 10X and the opening 10Z. The wiring pattern 24 is circular in a plan view, for example.

As illustrated in FIG. 16A, the metal plate 20 exposes the outer edge of the upper surface 10A of the core substrate 10, and covers the upper surface 10A except for the outer edge and the opening 10Z. The metal plate 20 covers the open end of the opening 10X on the side of the upper surface 10A. The metal plate 20 has a substantially rectangular opening 20Y in a plan view, which has the substantially same dimension as the opening 10Z, at the position facing the opening 10Z of the core substrate 10 (position overlapping the opening 10Z in the plan view). Accordingly, as illustrated in FIG. 15, the opening 10Z communicates with the opening 20Y, and the upper surface 25A of the metal plate 25 is exposed from the openings 10Z and 20Y. Further, as illustrated in FIG. 16A, the metal plate 20 also extends on the outer circumference of the wiring pattern 23. The metal plate 20 has the substantially circular opening 20X in a plan view, which is larger than the wiring pattern 23 in the plan view, in the region where the wiring pattern 23 is formed. The substantially circular wiring pattern 23 in the plan view is formed in the opening 20X. Accordingly, the upper surface 10A of the core substrate 10 is annularly exposed from the metal plate 20 and the wiring pattern 23 between the metal plate 20 and the wiring pattern 23.

As illustrated in FIG. 16B, the metal plate 25 exposes the outer edge of the lower surface 10B of the core substrate 10, and covers the lower surface 10B except for the outer edge and the opening 10X. The metal plate 25 covers the open end of the opening 10Z on the side of the lower surface 10B. The metal plate 25 has a substantially rectangular opening 25X in a plan view, which has the substantially same dimension as the opening 10X, at a position facing the opening 10X of the core substrate 10 (position overlapping the opening 10X in the plan view). Thus, as illustrated in FIG. 15, the opening 10X communicates with the opening 25X, and the lower surface 20B of the metal plate 20 is exposed from the openings 10X and 25X. As illustrated in FIG. 16B, the metal plate 25 also extends on the outer circumference of the wiring pattern 24. The metal plate 25 has a substantially circular opening 25Y in a plan view, which is larger than the wiring pattern 24 in the plan view, in the region where the wiring pattern 24 is formed. The substantially circular wiring pattern 24 in the plan view is formed in the opening 25Y. Accordingly, the lower surface 10B of the core substrate 10 is annularly exposed from the metal plate 25 and the wiring pattern 24 between the metal plate 25 and the wiring pattern 24.

Examples of the materials for the metal plates 20 and 25 and the wiring patterns 23 and 24 include copper, aluminum, iron, nickel or an alloy containing at least one of these metals.

The metal plates 20 and 25 are thinner than the semiconductor chips 30 and 32. To reduce warp of the semiconductor package 1B, the thickness of the metal plate 20 is preferably about 50 to 95% of the thickness of the semiconductor chip 30. To reduce warp of the semiconductor package 1B, the thickness of the metal plate 25 is preferably about 50 to 95% of the thickness of the semiconductor chip 32. The metal plates 20 and 25 each may have a thickness of about 15 to 70

μm. The outer dimension (planar shape) of the metal plate 20 is set to be smaller than that of the semiconductor package 1B, and larger than that of the semiconductor chip 30. The planar shape of the metal plate 20 is set such that the ratio of the area occupied by the metal plate 20 to the area of the insulating layer 21 illustrated in FIG. 15 is in the range of about 50 to 90%. When the material for the metal plate 20 is copper, the planar shape of the metal plate 20 is set such that the ratio of remaining copper in the metal plate 20 is in the range of about 50 to 90%. The outer dimension (planar shape) of the metal plate 25 is set to be smaller than that of the semiconductor package 1B and large than that of the semiconductor chip 32. The planar shape of the metal plate 25 is set such that the ratio of the area occupied by the metal plate 25 to the area of the insulating layer 40 is in the range of about 50 to 90%. When the material for the metal plate 25 is copper, the planar shape of the metal plate 25 is set such that the ratio of remaining copper in the metal plate 25 is in the range of about 50 to 90%.

The semiconductor chip 30 is bonded to the lower surface 20B of the metal plate 20, which is exposed from the opening 10X of the core substrate 10, via the bonding member 31. For example, the semiconductor chip 30 is bonded to the lower surface 20B of the metal plate 20 via the bonding member 31, with the surface opposite to the circuit formation surface 30B facing the lower surface 20B of the metal plate 20, that is, in the face-up state. The semiconductor chip 30 is housed in the housing part defined by the metal plate 20 and the opening 10X of the core substrate 10, with the electrode terminal 30P facing downward. The semiconductor chip 30 bonded to the metal plate 20 is also thermally connected to the metal plate 20 via the bonding member 31.

The semiconductor chip 32 is bonded to the upper surface 25A of the metal plate 25, which is exposed from the opening 10Z of the core substrate 10, via a bonding member 32. The semiconductor chip 32 may be formed using the same electronic components as the semiconductor chip 30. A circuit formation surface (upper surface in FIG. 15) 32A of the semiconductor chip 32 has an electrode terminal 32P. The electrode terminal 32P is a columnar conductive post that extends downward from the circuit formation surface 32A of the semiconductor chip 32. Then, the semiconductor chip 32 is bonded to the upper surface 25A of the metal plate 25 via the bonding member 33 such that the upper surface 32A with the electrode terminal 32P faces the upper surface 25A of the metal plate 25, that is, in the face-up state. The semiconductor chip 32 is, for example, housed in the housing part defined by the metal plate 25 and the opening 10Z of the core substrate 10, with the electrode terminal 32P facing upward. The semiconductor chip 32 bonded to the metal plate 25 is also thermally connected to the metal plate 25 via the bonding member 33. The electrode terminal 32P may have a height of about 10 to 30 μm. When the electrode terminal 32P is columnar, the electrode terminal 32P may have a diameter of about 30 to 50 μm. Examples of the material for the electrode terminal 32P include copper and copper alloy.

The semiconductor chip 32 can be dimensioned to be about 5 mm×5 mm to 11 mm×11 mm in a plan view. The semiconductor chip 32 may have a thickness of about 50 to 200 μm. In an example, the total thickness of the metal plate 20 and the core substrate 10 is equal to or larger than the thickness of the semiconductor chip 32 (including the circuit formation surface 32A or the electrode terminal 32P). The total thickness of the metal plate 25 and the core substrate 10 is equal to or larger than the thickness of the semiconductor chip 30 (including the circuit formation surface 30B or the electrode terminal 30P).

The insulating layer 21 covers the upper surface 20A and the side surfaces 20C of the metal plate 20, the upper surface and the side surfaces of the wiring pattern 23, the upper surface 10A of the core substrate 10 which is exposed from the metal plate 20 and the wiring pattern 23, the inner side surfaces of the openings 10Z and 20Y, the upper surface 25A of the metal plate 25, the upper surface 32A and the side surfaces of the semiconductor chip 32, and the entire electrode terminal 32P. Accordingly, the openings 10Z and 20Y are filled with the insulating layer 21, and space between the metal plate 20 and the wiring pattern 23 is filled with the insulating layer 21. The insulating layer 21 has the via hole VH3 that penetrates the insulating layer 21 to expose the upper surface of the wiring pattern 23, and a via hole VH5 that penetrates the insulating layer 21 to expose the upper surface of the electrode terminal 32P.

The wiring layer 91 has the via wire 91A filled in the via holes VH3 and VH5 and the wiring pattern 91B formed on the upper surface of the insulating layer 21. The wiring pattern 91B is electrically connected to the wiring pattern 23 through the via wire 91A filled in the via hole VH3, and is electrically connected to the electrode terminal 32P through the via wire 91A filled in the via hole VH5.

The insulating layer 40 covers the lower surface 25B and the side surfaces 25C of the metal plate 25, the lower surface and the side surfaces of the wiring pattern 24, the lower surface 10B of the core substrate 10 which is exposed from the metal plate 25 and the wiring pattern 24, the inner side surfaces of the openings 10X and 25X, the lower surface 20B of the metal plate 20, the lower surface 30B and the side surfaces of the semiconductor chip 30, and the entire electrode terminal 30P. Accordingly, the openings 10X and 25X are filled with the insulating layer 40, and space between the metal plate 25 and the wiring pattern 24 is filled with the insulating layer 40. The insulating layer 40 has the via hole VH1 that penetrates the insulating layer 40 to expose the lower surface of the electrode terminal 30P, and the via hole VH4 that penetrates the insulating layer 40 to expose the lower surface of the wiring pattern 24.

As has been described, the semiconductor package 1B includes the semiconductor chip 30 bonded to the lower surface 20B of the metal plate 20 in the face-up state from the side of the lower surface 10B of the core substrate 10, and the semiconductor chip 32 bonded to the upper surface 25A of the metal plate 25 in the face-up state from the side of the upper surface 10A of the core substrate 10. The semiconductor chips 30 and 32 are implemented from both of the upper and lower sides of the semiconductor package 1B to be included in the semiconductor package 1B. The metal plate 20 is an example of a first metal plate. The metal plate 25 is an example of a second metal plate.

Next, a method of manufacturing the semiconductor package 1B will be described. Although one enlarged semiconductor package will be described below, in fact, a member that will become a plurality of semiconductor packages 1B is manufactured on one substrate and then, the member is separated into individual semiconductor packages 1B.

Figure 17A:
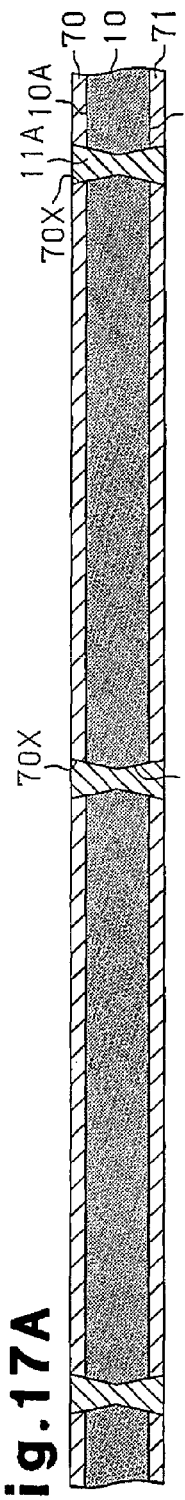

As illustrated in FIG. 17A, first, the metal layer 70 that is a base material for the metal plate 20 and the wiring pattern 23 is adhered to the upper surface 10A of the core substrate 10, and the metal layer 71 that is a base material for the metal plate 25 and the wiring pattern 24 is adhered to the lower surface 10B to prepare a copper clad laminated (CCL). In the illustrated example, a large substrate for many semiconductor packages 1B is used as the core substrate 10.

Subsequently, according to the same manufacturing steps as the steps illustrated in FIGS. 10A and 10B, the through hole 70X penetrating the core substrate 10 and the metal layers 70 and 71 in a thickness direction is formed at a required position of the copper clad laminated, and the conductive layer 11A that fills the through hole 70X is formed.

Figure 17B:
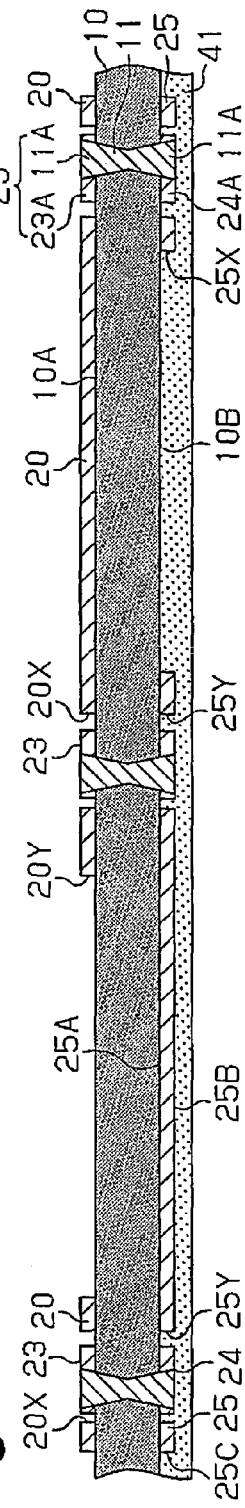

Next, according to the same manufacturing steps as the steps illustrated in FIGS. 10C and 10D, the metal layers 70 and 71 are patterned into a predetermined shape. As illustrated in FIG. 17B, the metal plate 20 and the wiring pattern 23 are formed on the upper surface 10A of the core substrate 10, and the metal plate 25 and the wiring pattern 24 are formed on the lower surface 10B of the core substrate 10. Accordingly, the metal plate 20 and the wiring pattern 23 are electrically separated from each other, and the metal plate 25 and the wiring pattern 24 are electrically separated from each other. The conductive layer 23A and the conductive layer 11A connected to the side surfaces of the conductive layer 23A constitute the wiring pattern 23, and the conductive layer 24A and the conductive layer 11A connected to the side surfaces of the conductive layer 24A constitute the wiring pattern 24. A part of the conductive layer 11A formed in the through holes 10Y becomes the through electrode 11.

Subsequently, an insulating layer 41 is formed on the lower surface 10B of the core substrate 10 so as to cover the lower surface 25B and the side surfaces 25C of the metal plate 25, and the lower surface and side surfaces of the wiring pattern 24. The insulating layer 41 can be formed by laminating a resin film on the lower surface 10B of the core substrate 10 and then, applying heat, while pressing the resin film, at a temperature of about 170 to 190° C. to be hardened.

Figure 17C:
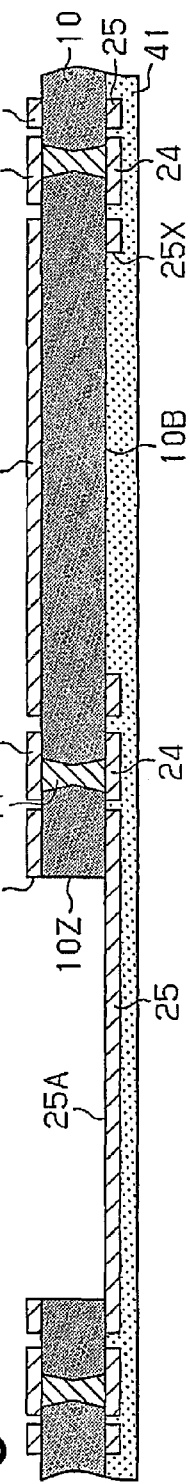

Next, in a step illustrated in FIG. 17C, according to the same manufacturing steps as the steps illustrated in FIG. 4A to FIG. 4C, the opening 10Z is formed at a required position of the core substrate 10 (position overlapping the openings 20X of the metal plate 20 in a plan view). Thereby, the upper surface 25A of the metal plate 25 is exposed from the openings 20X and the opening 10Z.

Figure 17D:
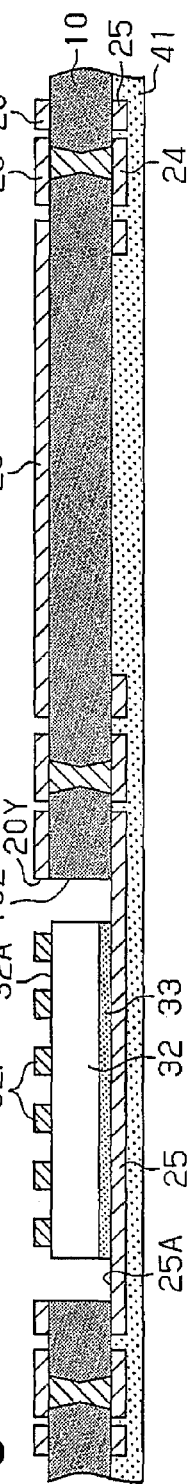

Next, in a step illustrated in FIG. 17D, the semiconductor chip 32 is bonded on the upper surface 25A via the bonding member 33 such that a surface (for example, lower surface) of the semiconductor chip 32 opposite to the circuit formation surface 32A faces the upper surface 25A of the metal plate 25, that is, in the face-up state. Thereby, the semiconductor chip 32 is housed in the housing part defined by the metal plate 25 and the openings 10Z and 20Y, and is implemented on the metal plate 25.

Subsequently, in a step illustrated in FIG. 18A, according to the same manufacturing steps as the steps illustrated in FIG. 4A to FIG. 4C, the openings 10X and 41X are respectively formed at required positions of the core substrate 10 and the insulating layer 41 (positions overlapping an opening 25X of the metal plate 25). For example, the openings 10X and 41X can be formed by blasting such as sandblasting. The openings 10X and 41X can be also formed by laser processing, router processing, or dry etching. In this step, the openings 10X, 25X, and 41X communicate with each other to expose the lower surface 20B of the metal plate 20 from the openings 10X, 25X, and 41X.

Next, the semiconductor chip 32 is bonded on the lower surface 20B via the bonding member 31 such that the surface (for example, upper surface) of semiconductor chip 30 opposite to the circuit formation surface 30B faces the lower surface 20B of the metal plate 20, that is, in the face-up state. Accordingly, the semiconductor chip 30 is housed in the housing part defined by the metal plate 20 and the openings 10X and 25X, and is implemented on the metal plate 20.

According to the manufacturing method in the third embodiment, one semiconductor chip 32 of the two included semiconductor chips 30 and 32 is implemented on the metal plate 25, and the other semiconductor chip 30 is implemented on the metal plate 20.

Next, in a step illustrated in FIG. 18B, according to the same manufacturing steps as the steps illustrated in FIGS. 5A and 52, the insulating layer 21 that fills the openings 10Z and 20Y as well as covers the semiconductor chip 32, the metal plate 20, the wiring pattern 23, and the like is formed. Further, in this step, an insulating layer 42 that fills the openings 10X, 25X, and 41X and covers the semiconductor chip 30, the insulating layer 41, and the like is formed. Accordingly, the insulating layer 40 including the insulating layer 41 and the insulating layer 42 is formed.

Subsequently, in a step illustrated in FIG. 18C, according to the same manufacturing steps as the steps illustrated in FIGS. 11C and 11D, the via holes VH3 and VH5 are formed on the insulating layer 21, the via holes VH1 and VH4 are formed on the insulating layer 40, the wiring layer 91 is stacked on the insulating layer 21, and the first wiring layer 51 is stacked on the insulating layer 40.

Next, in a step illustrated in FIG. 18D, according to the same manufacturing step as the step illustrated in FIG. 12, the solder resist layer 60 having the opening 60X that exposes a portion of the first wiring layer 51 (wiring pattern 51B) is stacked on the lower surface 40B of the insulating layer 40. The solder resist layer 92 having the opening 92X that exposes a portion of the wiring layer 91 (wiring pattern 91B) is stacked on the upper surface 21A of the insulating layer 21. Next, the external connection terminal 61 is formed on the external connection pad 53P. After that, the semiconductor package 1A illustrated in FIG. 7 can be obtained by cutting the structure illustrated in FIG. 18D into regions corresponding to individual semiconductor packages 1B (refer to arrows in this figure).

The third embodiment can achieve following effects in addition to the effects (1) to (7) in the first embodiment.

(8) According to the conventional manufacturing method, it is difficult to include a semiconductor chip from both of an upper and lower sides of a semiconductor package. Describing in more detail, according to the conventional manufacturing method, the semiconductor chip is mounted on the support substrate in the face-up state, an insulating layer that seals the semiconductor chip is formed, and a wiring structure is formed on the insulating layer. After that, the support substrate is removed. Since the support substrate is formed on one surface of the semiconductor package in the manufacturing process, it is difficult to include the semiconductor chip from the side of the one surface.

According to the manufacturing method in the third embodiment, the metal plates 20 and 25 are formed by patterning the metal layers 70 and 71 formed on the upper surface 10A of the core substrate 10 and the lower surface 10B, respectively, and the openings 10X and 10Z are respectively formed by removing the required portions of the core substrate 10. Then, the semiconductor chips 30 and 32 are respectively mounted on the metal plates 20 and 25 exposed from the openings 10X and 10Z. The core substrate 10 and the metal layers 70 and 71 thus formed on the core substrate 10 are processed, and the semiconductor chips 30 and 32 are housed in the housing parts formed by the processing (the housing part defined by the metal plate 20 and the opening 10X, and the housing part defined by the metal plate 25 and the opening 10Z). According to such manufacturing method, the semiconductor chips 30 and 32 can be included (implemented) from both of the upper surface 10A and the lower surface 10B of the core substrate 10. Thus, since the direction of implementing (including) the semiconductor chips 30 and 32 can be freely selected according to specifications of electronic equipment including the semiconductor package 1B, the degree of freedom in design can be improved.

As in this embodiment, the semiconductor chip 30 can be included in the state where the electrode terminal 30P of one semiconductor chip 30 faces downward, and the semiconductor chip 32 can be included in the state where the electrode terminal 32P of the other semiconductor chip 32 faces upward.

Accordingly, the distance between the electrode terminal 30P and the external connection pad 53P can be decreased, and the distance between the electrode terminal 32P and the connection pad 91P can be decreased.

The embodiments may be modified as follows.

Figure 19:
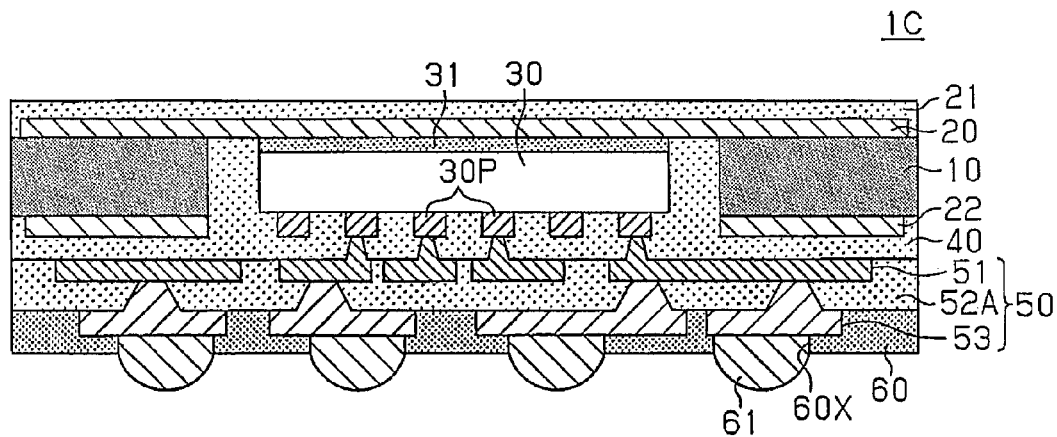
FIGS. 19 to 22 are schematic sectional view illustrating a semiconductor package in the modification example.

In each of the above-mentioned embodiments, the outermost interlayer insulating layer 52 on the opposite side to the insulating layer 21 is the reinforcement-containing insulating layer. The thermal expansion coefficient of the interlayer insulating layer 52 is set to be closer to the thermal expansion coefficient of the semiconductor chip 30 than the thermal expansion coefficient of the insulating layers 21 and 40. However, as in the semiconductor package 1C illustrated in FIG. 19, the outermost interlayer insulating layer 52A on the opposite side to the insulating layer 21 may be an insulating layer containing no reinforcement. The material for the interlayer insulating layer 52A in this case may be the same insulating resin as the material for the insulating layer 40. Examples of the material for the interlayer insulating layer 52A include thermosetting epoxy insulating resin. The insulating resins are not limited to thermosetting resins, and may be photosensitive insulating resins.

Figure 20:
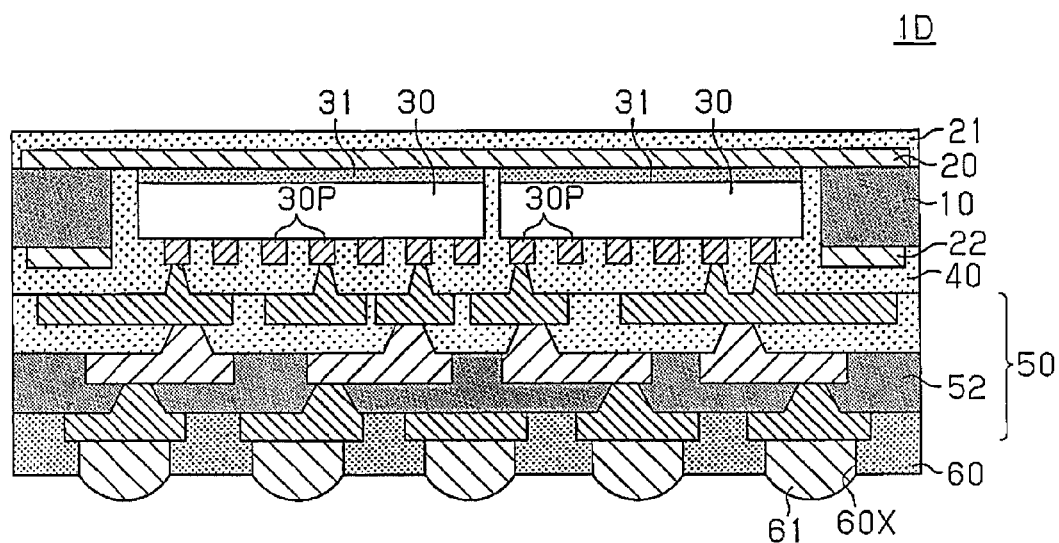

The semiconductor packages 1 and 1A in the first and second embodiments include one semiconductor chip 30. However, as illustrated in FIG. 20, a semiconductor package 1D including a plurality of semiconductor chips 30 may be embodied. In this case, as in the example in FIG. 20, a plurality of semiconductor chips 30 may be housed in one opening 10X, or one semiconductor chip 30 may be housed in each of the plurality of opening 10X. Even when the plurality of semiconductor chip 30 are included, among the interlayer insulating layers in the wiring structure 50, the outermost interlayer insulating layer 52 on the opposite side to the insulating layer 21 is preferably, the reinforcement-containing insulating layer.

Figure 21:
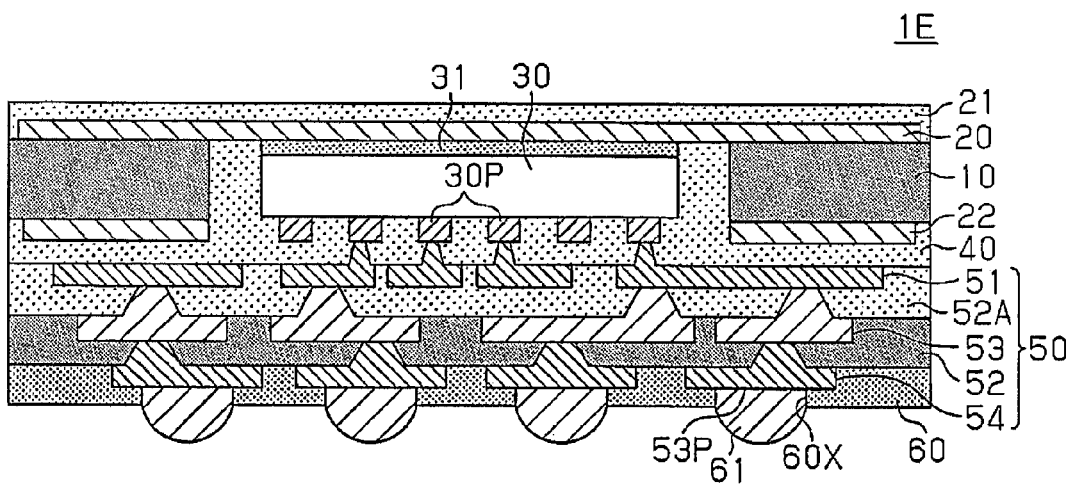

In the first embodiment, the wiring structure 50 has the first wiring layer 51, the interlayer insulating layer 52, and the second wiring layer 53. However, the number of each of the wiring layer and the interlayer insulating layer in the wiring structure 50 is not limited. For example, in the wiring structure 50, three or more wiring layers and two or more interlayer insulating layers may be alternately stacked. In this case, at least one (for example, the outermost interlayer insulating layer) of the interlayer insulating layers in the wiring structure 50 may be the reinforcement-containing insulating layer. As in the semiconductor package 1E illustrated in FIG. 21, the wiring structure 50 may be formed by alternately stacking the three wiring layers 51, 53, and 54 and the two interlayer insulating layers 52A and 52. In the semiconductor package 1E, the lowermost interlayer insulating layer 52 of the interlayer insulating layers 52A and 52 includes the reinforcement.

Figure 22:
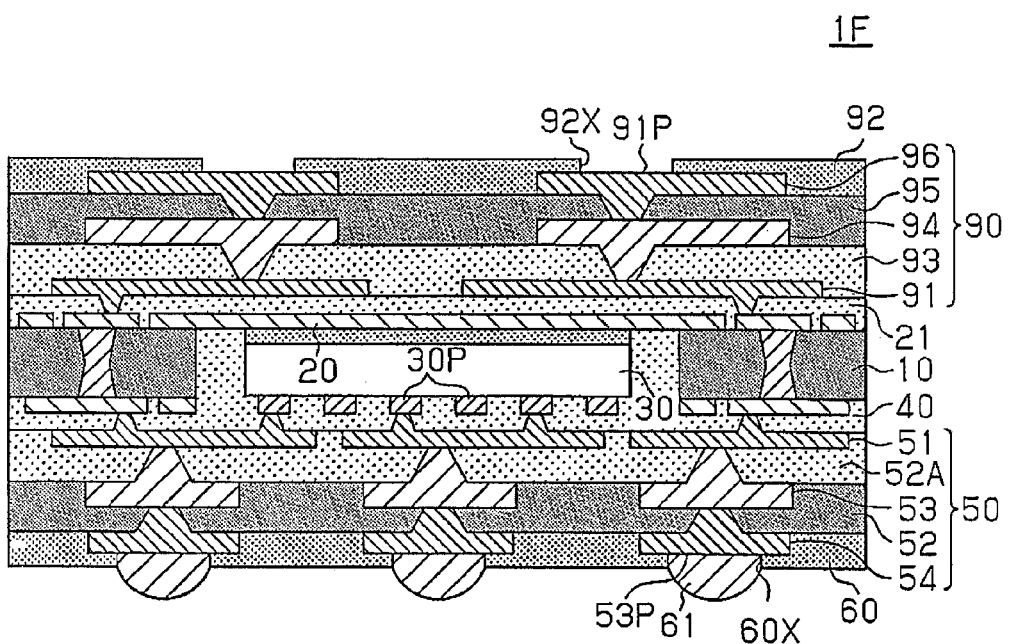

In the second and third embodiments, the wiring structure 50 has only the first wiring layer 51, and the wiring structure 90 has only the wiring layer 91. However, like the wiring structure 50 in the first embodiment and the wiring structure 50 illustrated in FIG. 21, the wiring structures 50 and 90 in the second and third embodiments may have a configuration in which two or more wiring layers and one or more interlayer insulating layers are alternately stacked. The number of each of the wiring layers and the interlayer insulating layers in the wiring structures 50 and 90 is not limited. In this case, at least one interlayer insulating layer (for example, the outermost interlayer insulating layer) among the interlayer insulating layers in the wiring structures 50 and 90 may be the reinforcement-containing interlayer insulating layer. As in the semiconductor package 1F illustrated in FIG. 22, the wiring structure 50 may have a configuration in which the three wiring layers 51, 53, and 54 and the two interlayer insulating layers 52A and 52 are alternately stacked, and the wiring structure 90 may have a configuration in which the three wiring layers 91, 94, and 96 and the two interlayer insulating layers 93 and 95 are alternately stacked. In the semiconductor package 1F, the lowermost interlayer insulating layer 52 of the interlayer insulating layers 52A and 52 in the wiring structure 50 is the reinforcement-containing insulating layer, and the topmost interlayer insulating layer 95 of the interlayer insulating layers 93 and 95 in the wiring structure 90 is the reinforcement-containing insulating layer. A topmost (outermost) wiring layer 96 among the wiring layers 91, 94, and 96 in the wiring structure 90 has the connection pad 91P electrically connected to another semiconductor package 3.

In each of the above-mentioned embodiments, the semiconductor packages 1, 1A, and 113 including the semiconductor chips 30 and 32 are exemplified. However, in place of the semiconductor chips 30 and 32, a semiconductor package including an electronic component such as a chip resistor or a chip capacitor may be embodied.

Each of the openings 10X and 10Z of the core substrate 10 in each of the above-mentioned embodiments is substantially rectangular in a sectional view. However, each of the openings 10X and 10Z may be substantially trapezoidal in the sectional view, or substantially hourglass-like in the sectional view.

In the second and third embodiments, the through hole 10Y of the core substrate 10 is substantially hourglass-like in a sectional view. However, the through hole 10Y may be substantially rectangular (straight) in the sectional view, or substantially trapezoidal in the sectional view.

In the second and third embodiments, the through electrode 11 fills the through hole 10Y. However, the through electrode 11 may be a conformal via. The shape of the through electrode 11 is not limited as long as it covers the inner wall surface of the through hole 10Y, and electrically connects the wiring patterns 23 and 24 formed on the upper surface 10A and the lower surface 10B of the core substrate 10.

In the second and third embodiments, the wiring structure 90 (the wiring layer 91) and the solder resist layer 92 may be omitted. In this case, an opening that penetrates the insulating layer 21 to expose a portion of the upper surface of the wiring pattern 23 as a connection pad, may be formed at a required position of the insulating layer 21.

According to the manufacturing method in each of the above-mentioned embodiments, many semiconductor packages can be manufactured at one time, and one semiconductor package can be also manufactured.

In the semiconductor packages 1, 1A, and 1B in the above-mentioned embodiments, the number of layers and wiring arrangement can be variously modified and changed.

In the semiconductor package 3 in the second embodiment, the number of semiconductor chips implemented on the wiring board 100, and the mounting mode of a semiconductor chip (for example, flip-chip packaging, wire bonding, or combination thereof) can be variously modified and changed.

The disclosure further encompasses various examples described below.

[Clause 1] A semiconductor package comprising:
a core substrate made of reinforcement-containing insulating resin, the core substrate having a first surface, a second surface opposite to the first surface, and first and second openings that penetrate the core substrate from the first surface to the second surface;
a first metal plate provided on the first surface of the core substrate, the first metal plate covering an open end of the second opening on the first surface of the core substrate, and exposing an outer edge of the first surface of the core substrate and covering the first surface of the core substrate except for the outer edge and the first opening;
a second metal plate provided on the second surface of the core substrate, the second metal plate covering an open end of the first opening on the second surface of the core substrate and exposing an outer edge of the second surface of the core substrate and covering the second surface of the core substrate except for the outer edge and the second opening;
a first electronic component bonded to a first surface of the first metal plate exposed through the second opening;
a second electronic component bonded to a first surface of the second metal plate exposed through the first opening;
a first insulating layer that fills the first opening, the first insulating layer covering the outer edge of the first surface of the core substrate, the second electronic component, a second surface opposite to the first surface of the first metal plate, and a side surface of the first metal plate;
a second insulating layer that fills the second opening, the second insulating layer covering the outer edge of the second surface of the core substrate, the first electronic component, a second surface opposite to the first surface of the second metal plate, and a side surface of the second metal plate;
a first wiring structure including a first wiring layer stacked on the second insulating layer and electrically connected to the first electronic component; and
a second wiring structure including a second wiring layer stacked on the first insulating layer and electrically connected to the second electronic component,
wherein
the first metal plate is thinner than the first electronic component, and the second metal plate is thinner than the second electronic component,
a total thickness of the first metal plate and the core substrate is equal to or larger than a thickness of the second electronic component, and
a total thickness of the second metal plate and the core substrate is equal to or larger than a thickness of the first electronic component.

[Clause 2] The semiconductor package according to clause 1, further comprising:
a plurality of through electrodes that fill a plurality of through holes provided around the first opening and the second opening, the through holes penetrating the core substrate;
a first wiring pattern electrically connected to one ends of the plurality of through electrodes and surrounded by and separated from the first metal plate on the first surface of the core substrate; and
a second wiring pattern electrically connected to the other ends of the plurality of through electrodes and surrounded by and separated from the second metal plate.

[Clause 3] A semiconductor device comprising:
the semiconductor package according to clause 1; and
another semiconductor package stacked on the semiconductor package.

[Clause 4] A method of manufacturing a semiconductor package, comprising:
preparing a structure including a core substrate, a first metal layer stacked on a first surface of the core substrate, and a second metal layer stacked on a second surface opposite to the first surface of the core substrate;
forming a metal plate by patterning the first metal layer, wherein the patterning includes exposing an outer edge of the first surface of the core substrate, the metal plate covering the first surface of the core substrate except for the outer edge;
forming a conductive layer by patterning the second metal layer, wherein the patterning includes exposing an outer edge of the second surface of the core substrate and forming an opening that penetrates the second metal layer to expose a certain location of the second surface of the core substrate, the conductive layer covering the second surface of the core substrate except for the outer edge and the opening;
forming a first opening that penetrates the core substrate by removing the core substrate exposed from the opening from the second surface of the core substrate;
bonding an electronic component on a first surface of the metal plate exposed from the first opening;
forming a first insulating layer that covers a second surface opposite to the first surface of the metal plate, a side surface of the metal plate, and the outer edge of the first surface of the core substrate;
forming a second insulating layer that fills the first opening, and covers the outer edge of the second surface of the core substrate, the conductive layer, and the electronic component;
forming a wiring structure including a wiring layer electrically connected to the electronic component, on the second insulating layer; and
determining thicknesses of the metal plate, the conductive layer, and the core substrate such that the metal plate is thinner than the electronic component, and a total thickness of the conductive layer and the core substrate is equal to or larger than a thickness of the electronic component.

[Clause 5] The manufacturing method according to clause 4, wherein the forming the metal plate and the forming the conductive layer include
forming a through hole that penetrates the core substrate around the first opening,
forming a through electrode in the through hole,
forming the metal plate and a first wiring pattern that is connected to one end of the through electrode and is surrounded by and separated from the metal plate, by patterning the first metal layer, and
forming the conductive layer and a second wiring pattern that is connected to the other end of the through electrode and is surrounded by and separated from the conductive layer, by patterning the second metal layer.

[Clause 6] The manufacturing method according to clause 4, wherein
the forming the first insulating layer is performed before the forming the first opening, and
the forming the first insulating layer includes stacking a support body that covers the entire first surface of the first insulating layer on the first insulating layer,
the method further comprising removing the support body after the forming the second insulating layer and before the forming the wiring structure.

[Clause 7] A method of manufacturing a semiconductor package, comprising:
preparing a structure including a core substrate, a first metal layer stacked on a first surface of the core substrate, and a second metal layer stacked on a second surface opposite to the first surface of the core substrate;

forming a first metal plate by patterning the first metal layer, wherein the patterning includes exposing an outer edge of the first surface of the core substrate and forming an opening that penetrates the first metal layer to expose a certain location of the first surface of the core substrate, the first metal plate covering the first surface of the core substrate except for the outer edge and the opening;

forming a second metal plate by patterning the second metal layer, the patterning includes exposing an outer edge of the second surface of the core substrate and forming an opening that penetrates the second metal layer to expose a certain location of the second surface of the core substrate, the second metal plate covering the second surface of the core substrate except for the outer edge and the opening;

forming a first opening that penetrates the core substrate by removing the core substrate exposed from the opening of the first metal plate;

bonding a second electronic component on a first surface of the second metal plate exposed from the first opening;

forming a second opening that penetrates the core substrate by removing the core substrate exposed from the opening of the second metal plate;

bonding a first electronic component on a first surface of the first metal plate exposed from the second opening;

forming a first insulating layer that fills the first opening, and covers the outer edge of the first surface of the core substrate, the second electronic component, a second surface opposite to the first surface of the first metal plate, and a side surface of the first metal plate;

forming a second insulating layer that fills the second opening, and covers the outer edge of the second surface of the core substrate, the first electronic component, a second surface opposite to the first surface of the second metal plate, and a side surface of the second metal plate;

forming a first wiring structure including a first wiring layer electrically connected to the first electronic component on the second insulating layer;

forming a second wiring structure including a second wiring layer electrically connected to the second electronic component on the first insulating layer; and determining thicknesses of the first metal plate, the second metal plate, and the core substrate such that the first metal plate is thinner than the first electronic component, the second metal plate is thinner than the second electronic component, a total thickness of the first metal plate and the core substrate is equal to or larger than a thickness of the second electronic component, and a total thickness of the second metal plate and the core substrate is equal to or larger than a thickness of the first electronic component.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A semiconductor package comprising:
    a core substrate made of a reinforcement-containing insulating resin, the core substrate including a first surface, a second surface opposite to the first surface, and a first opening penetrating the core substrate from the first surface to the second surface;
    a metal plate that covers an open end of the first opening on the first surface of the core substrate, the metal plate exposing an outer edge of the first surface of the core substrate and covering the first surface of the core substrate except for the outer edge;
    a conductive layer that covers the second surface of the core substrate and including an opening communicating with the first opening, the conductive layer exposing an outer edge of the second surface of the core substrate and covering the second surface of the core substrate except for the outer edge and the first opening;
    an electronic component bonded to a first surface of the metal plate exposed through the first opening;
    a first insulating layer that covers a second surface of the metal plate opposite to the first surface of the metal plate, a side surface of the metal plate, and the outer edge of the first surface of the core substrate;
    a second insulating layer that fills the first opening, the second insulating layer covering the outer edge of the second surface of the core substrate, the conductive layer, and the electronic component; and
    a first wiring structure stacked on the second insulating layer, the first wiring structure including a first wiring layer electrically connected to the electronic component,
    wherein the metal plate is thinner than the electronic component, and a total thickness of the conductive layer and the core substrate is equal to or larger than a thickness of the electronic component.

2. The semiconductor package according to claim 1, further comprising:
    a through electrode provided around the first opening, the through electrode filling a through hole penetrating the core substrate;
    a first wiring pattern electrically connected to one end of the through electrode and surrounded by and separated from the metal plate on the first surface of the core substrate; and
    a second wiring pattern electrically connected to the other end of the through electrode and separated from the conductive layer on the second surface of the core substrate.

3. The semiconductor package according to claim 2, further comprising:
    a second wiring structure including a second wiring layer that is stacked on the first insulating layer and electrically connected to the first wiring pattern; and
    a solder resist layer formed on the first insulating layer to partially cover the first wiring layer, the second wiring layer including a pad, which is exposed from an opening of the solder resist layer and is configured to be connected to another semiconductor package, on the outermost side of the second wiring structure.

4. The semiconductor package according to claim 1, wherein
    the first wiring structure has an alternate stacked structure including the first wiring layer and an interlayer insulating layer stacked on the first wiring layer, and
    the interlayer insulating layer is an outermost interlayer insulating layer on the opposite side to the first insulating layer, and is made of a reinforcement-containing insulating resin.

5. A semiconductor device comprising:
    the semiconductor package according to claim 1; and
    another semiconductor package stacked on the semiconductor package.

* * * * *